United States Patent
Huibers et al.

(10) Patent No.: US 6,906,847 B2
(45) Date of Patent: Jun. 14, 2005

(54) SPATIAL LIGHT MODULATORS WITH LIGHT BLOCKING/ABSORBING AREAS

(75) Inventors: Andrew G. Huibers, Mountain View, CA (US); Satyadev R. Patel, Elk Grove, CA (US)

(73) Assignee: Reflectivity, INC, Sunnyvale, CA (US)

( * ) Notice: Subject to any disclaimer, the term of this patent is extended or adjusted under 35 U.S.C. 154(b) by 0 days.

(21) Appl. No.: 10/305,536

(22) Filed: Nov. 26, 2002

(65) Prior Publication Data

US 2004/0100677 A1 May 27, 2004

Related U.S. Application Data

(63) Continuation-in-part of application No. 10/005,308, filed on Dec. 3, 2001.
(60) Provisional application No. 60/254,043, filed on Dec. 7, 2000, and provisional application No. 60/276,222, filed on Mar. 15, 2001.

(51) Int. Cl.[7] .......................... G02B 26/00; G02B 26/08
(52) U.S. Cl. ...................... 359/291; 359/295; 359/298; 359/224
(58) Field of Search ................................ 359/223–224, 359/290–292, 295, 298

(56) References Cited

U.S. PATENT DOCUMENTS

| | | | |
|---|---|---|---|
| 4,383,255 A | | 5/1983 | Grandjean et al. |
| 4,564,836 A | | 1/1986 | Vuilleumier et al. |
| 5,719,695 A | | 2/1998 | Heimbuch |
| 5,835,256 A | | 11/1998 | Huibers |
| 5,999,306 A | * | 12/1999 | Atobe et al. ................. 359/295 |
| 6,046,840 A | | 4/2000 | Huibers |
| 6,071,616 A | | 6/2000 | Sulzbach et al. |
| 6,282,010 B1 | | 8/2001 | Sulzbach et al. |
| 6,469,821 B2 | * | 10/2002 | Bartlett et al. ............... 359/292 |
| 6,590,695 B1 | * | 7/2003 | Kurtz et al. ................. 359/291 |
| 6,753,846 B2 | * | 6/2004 | Takeuchi et al. ............. 345/108 |
| 6,806,992 B2 | * | 10/2004 | Soneda et al. ............... 359/291 |
| 2002/0056900 A1 | | 5/2002 | Liu et al. |
| 2002/0109903 A1 | | 8/2002 | Kaeriyama |
| 2002/0126389 A1 | * | 9/2002 | Moseley et al. ............. 359/619 |
| 2004/0012838 A1 | * | 1/2004 | Huibers ....................... 359/291 |
| 2004/0027636 A1 | * | 2/2004 | Miles .......................... 359/243 |
| 2004/0100594 A1 | * | 5/2004 | Huibers et al. ............... 349/25 |
| 2004/0100680 A1 | * | 5/2004 | Huibers et al. ............. 359/291 |

FOREIGN PATENT DOCUMENTS

EP  0069226 A2  3/1986

OTHER PUBLICATIONS

Cadman, New Micromechanical Display Using Thin Metallic Films, IEEE Electron Device Letters vol. EDL.4, No. 1, Jan. 1983.

Colgan, Optimazation of Light–Valve Mirrors, 1996 SID International Symposium—Digest of Technical Papers, vol. 29; Anaheim, CA; May 1998, pp. 1071–1074.

Melcher, High Information Content Projection Display Based on Reflective LC on Silicon Light Valves, 1998 SID International Symposium—Digest of Technical Papers, vol. 29; Anaheim, CA May 1998, pp. 25–28.

\* cited by examiner

Primary Examiner—Evelyn A. Lester
(74) Attorney, Agent, or Firm—Gregory R. Muir

(57) ABSTRACT

A projection system, a spatial light modulator, and a method for forming a micromirror array such as for a projection display are disclosed. The spatial light modulator can have two substrates bonded together with one of the substrates comprising a micro-mirror array. The two substrates can be bonded at the wafer level after depositing a getter material and/or solid or liquid lubricant on one or both of the wafers if desired. In one embodiment of the invention, one of the substrates is a light transmissive substrate and a light absorbing layer is provided on the light transmissive substrate to selectively block light from passing through the substrate. The light absorbing layer can form a pattern, such as a frame around an array of micro-mirrors.

99 Claims, 20 Drawing Sheets

SPATIAL LIGHT MODULATORS WITH LIGHT BLOCKING/ABSORBING AREAS

CROSS-REFERENCE TO RELATED APPLICATIONS

The present application is a Continuation in-Part of U.S. patent application Ser. No. 10/005,308 to Patel et al. filed Dec. 3, 2001, which claims priority from U.S. provisional application Ser. No. 60/254,043 filed Dec. 7, 2000 and U.S. provisional application Ser. No. 60/276,222 filed Mar. 15, 2001.

TECHNICAL FIELD OF THE INVENTION

The invention is related generally to spatial light modulators, and, more particularly, to spatial light modulators with light absorbing areas that reduce light from passing through a light transmissive substrate—such as around the periphery of an array of pixels in a spatial light modulator.

BACKGROUND OF THE INVENTION

Spatial Light Modulators (SLMs) are transducers that modulate an incident beam of light in a spatial pattern that corresponds to an optical or electrical input. A type of SLM is the SLM based on Micro Electro-Mechanical Systems (MEMS). A typical MEMS-based SLM consists of an array of micro-mirrors mounted on movable elements. Each individual micro-mirror can be independently deflected by an electrostatic force. Reflection of a beam of incident light impinging a micro-mirror can then be controlled, for example by deflecting the micro-mirror through changing the electrostatic force applied to the micro-mirror. MEMS-based SLMs have experienced significant developments and been innovatively implemented in many applications, one of which is the use in digital display systems. In a display application, each micro-mirror is associated with a pixel of a displayed image. To produce a bright pixel, the state of the micro-mirror associated with the pixel is set in such a way that the reflected light from the micro-mirror is directed onto a target for viewing. And to produce a dark pixel, the status of the micro-mirror is tuned such that the reflected light from the micro-mirror is directed away from the display device. In order to display a black-and-white image, the micro-mirror array is illuminated by a beam of light. By coordinating the reflective status of the micro-mirrors based on the brightness of the pixels of the desired image, the collective effect of all reflected lights from individual micromirrors is the generation of the desired image. Gray-scaled and colored-images can also be displayed using the micro-mirror array with the pulse-width-modulation and sequential-color-display techniques, which will not be discussed in detail herein.

Currently, varieties of MEMS-based SLMs have been developed. Regardless of the differences, the function of the MEMS-based SLMs for display is based on the reflection of light from individual micro-mirrors. Therefore, the quality of the displayed image strongly depends on the reflections of the micro-mirrors.

There are many things that define the quality of a displayed image. Contrast ratio is a major determinant of perceived image quality. Contrast ratio is the ratio of luminance between the brightest white that can be produced and the darkest black that can be produced. If a displayed image has high contrast ratio, a viewer will judge it to be sharper than a displayed image with lower contrast ratio, even if the lower contrast image has substantially more measurable resolution. Contrast ratio of a displayed image from a MEMS-based SLM can be seriously degraded by light scattered, for example, from the edges of the micro-mirrors and the structures below the micro-mirrors. This scattered light typically travels through the projection lens of the display device and is directed on to the target, even when the micro-mirrors are set for displaying a dark pixel.

Therefore, methods for use in MEMS-based SLMs are needed to improve the display quality.

SUMMARY OF THE INVENTION

In view of the forgoing, the present invention provides a spatial light modulator with light absorbing areas for improving display quality. In one embodiment of the invention, the light absorbing areas are disposed so as to decrease light that enters between gaps between micromirrors in the spatial light modulator.

In one embodiment of the invention, a method for making a spatial light modulator is provided, comprising providing a first substrate that is transmissive to visible light; providing a second substrate having an array of circuitry and electrodes thereon; depositing a light absorbing layer on the first substrate to selectively block the passage of light through the first substrate; forming an array of deflectable reflective elements on the first or second substrate; and positioning the first and second substrates proximate to each other to form a substrate assembly.

In another embodiment of the invention, a spatial light modulator is provided, comprising a first substrate that is transmissive to visible light; a second substrate having an array of circuitry and electrodes thereon; a light absorbing layer on the first substrate disposed to selectively block the passage of light through the first substrate; and an array of deflectable reflective elements on the first or second substrate; wherein the first and second substrates are positioned proximate to each other as a substrate assembly.

In a further embodiment of the invention, a projection system is provided, comprising a light source; a spatial light modulator for reflecting a beam of light from the light source; and projection optics for projecting light reflected off of the spatial light modulator; wherein the spatial light modulator comprises: a first substrate that is transmissive to visible light; a second substrate having an array of circuitry and electrodes thereon; a light absorbing layer on the first substrate disposed to selectively block the passage of light through the first substrate; and an array of deflectable reflective elements on the first or second substrate; wherein the first and second substrates are positioned proximate to each other as a substrate assembly.

In another aspect of the invention, a spatial light modulator, comprises a first substrate and a second substrate; an array of circuitry and electrodes on the second substrate; an opaque layer that forms a pattern on the first substrate in order to absorb at least 50% of the light that is incident on the opaque layer; and an array of deflectable reflective elements on the first or second substrate; wherein the first and second substrates are positioned proximate to each other as a substrate assembly.

In still a further example of the invention, a spatial light modulator is provided comprising: a first substrate and a second substrate disposed proximate to each other; circuitry, electrodes and micromirrors formed on the second substrate; and wherein the first substrate is a substrate transmissive to visible light and is disposed at a distance from the first substrate of 75 microns or less. Also a projection system is disclosed having such a spatial light modulator, a light source and projection optics.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIGS. 9A to 9G are step-by-step views of the assembly of the device;

DETAILED DESCRIPTION OF THE INVENTION

Mirror Fabrication:

Processes for fabricating a MEMS device such as a movable micro-mirror and mirror array are disclosed in U.S. Pat. Nos. 5,835,256 and 6,046,840 both to Huibers, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in FIGS. 1 to 4. By "light transmissive", it is meant that the material will be transmissive to light at least in operation of the device (The material could temporarily have a light absorbing layer on it to improve the ability to handle the substrate during manufacture, or a partial light absorbing layer for decreasing light scatter during use. Regardless, a portion of the substrate, for visible light applications, is preferably transmissive to visible light during use so that light can pass into the device, be reflected by the mirrors, and pass back out of the device. Of course, not all embodiments will use a light transmissive substrate). By "wafer" it is meant any substrate on which multiple micro-mirrors or microstructure arrays are to be formed, which allows for being divided into dies, each die having one or more micro-mirrors thereon. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional rounds or substantially round wafers (e.g. 4", 6" or 12" in diameter) so as to allow for manufacture in a standard foundry.

Figure 1A:
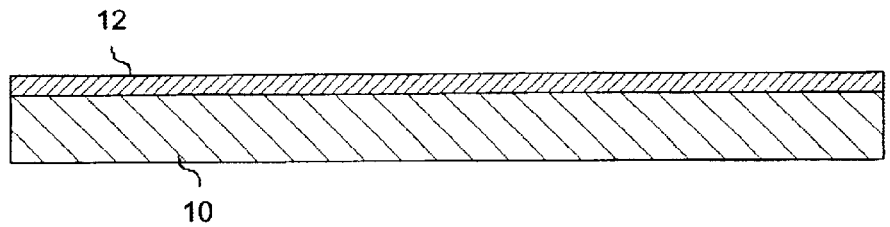
FIGS. 1A to 1E are cross-sectional views illustrating one method for forming micro-mirrors.

FIGS. 1A to 1E show a manufacturing process for a micro-mirror structure. As can be seen in FIG. 1A, a substrate such as glass (e.g. 1737F), quartz, Pyrex™, sapphire, (or silicon alone or with circuitry thereon) etc. is provided. The cross-section of FIGS. 1A–E is taken along line 1—1 of FIG. 2. Because this cross-section is taken along the hinge of the movable element, an optional block layer 12 can be provided to block light (incident through the light transmissive substrate during use) from reflecting off the hinge (or other underlying structure) and potentially causing diffraction and lowering the contrast ratio (if the substrate is transparent). This light-absorbing layer will be described in more detail in FIG. 14 to FIG. 17.

Figure 1B:
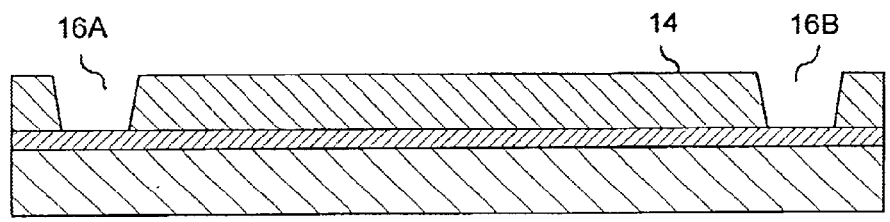

As shown in FIG. 1B, a sacrificial layer 14, such as amorphous silicon, is deposited. The thickness of the sacrificial layer can be wide ranging depending upon the movable element/mirror size and desired tilt angle, though a thickness of from 500 Å to 50,000 Å, preferably around 5000 Å is preferred. Alternatively, the sacrificial layer could be a polymer or polyimide (or even polysilicon, silicon nitride, silicon dioxide, etc. depending upon the materials selected to be resistant to the etchant, and the etchant selected). A lithography step followed by a sacrificial layer etch form holes 16a and 16b in the sacrificial silicon, which can be of any suitable size, though preferably having a diameter of from 0.1 to 1.5 um, preferably around 0.7±0.25 um. The etching is performed down to the glass/quartz substrate or down to the block layer if present. Preferably if the glass/quartz layer is etched, it is in an amount less than 2000 Å.

Figure 1C:
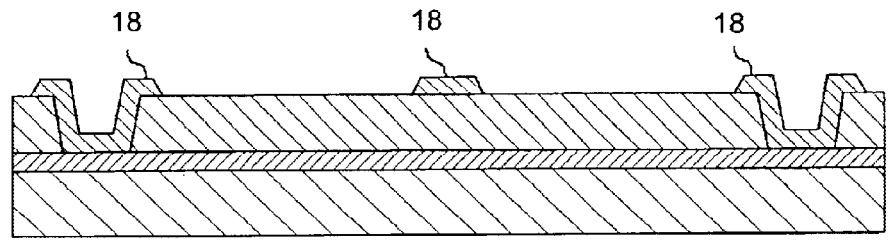

At this point, an shown in FIG. 1C, a first layer 18 is deposited by chemical vapor deposition. The material can be any suitable material, for example silicon nitride or silicon oxide deposited by LPCVD or PECVD—however polysilicon, silicon carbide (or other ceramic thin film) or an organic compound could be deposited at this point–or Al, CoSiNx, TiSiNx, TaSiNx arid other ternary and higher order compounds as set forth in U.S. patent applications 20020047172 filed Jul. 20, 2001, and 20020185699 filed Jun. 21, 2002 both to Reid and incorporated herein by reference (of course the sacrificial layer and etchant should be adapted to the material used). Also, laminate structures having various combinations of metals (or metal alloys) and ceramic films could be deposited. The thickness of this first layer can vary depending upon the movable element size and desired amount of stiffness of the element. However in one embodiment the layer has a thickness of from 100 to 3200 Å, more preferably around 1100 Å. The first layer undergoes lithography and etching so as to form gaps between adjacent movable elements on the order of from 0.1 to 25 um, preferably around 1 to 2 um.

Figure 1D:
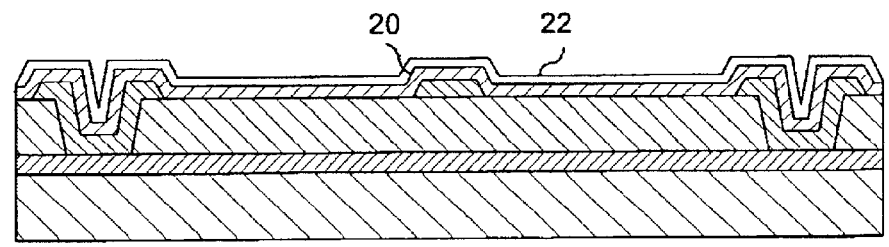

A second layer 20 (the "hinge" layer) is deposited as shown in FIG. 1D. By "hinge layer" it is meant the layer that defines that portion of the device that flexes to allow movement of the device. The hinge layer can be disposed only for defining the hinge, or for defining the hinge and other areas such as the mirror. In any case, the reinforcing material is removed prior to depositing the hinge material. The material for the second (hinge) layer can be the same (e.g. silicon nitride) as the first layer or different (e.g. any suitable material such as silicon oxide, silicon carbide, polysilicon, or Al, CoSiNx, TiSiNx, TaSiNx or other ternary and higher compounds) and can be deposited by chemical vapor deposition like the first layer. The thickness of the second/hinge layer can be greater or less than the first, depending upon the stiffness of the movable element, the flexibility of the hinge desired, the material used, etc. In one embodiment the second layer has a thickness of from 50 Å to 2100 Å, preferably around 500 Å. In another embodiment, the first layer is deposited by PECVD and the second layer by LPCVD.

Figure 1E:
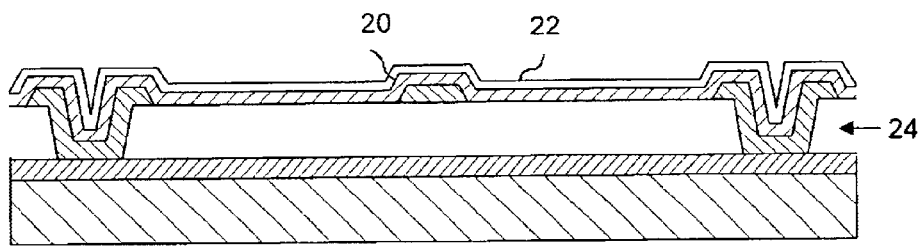
Figure 2:
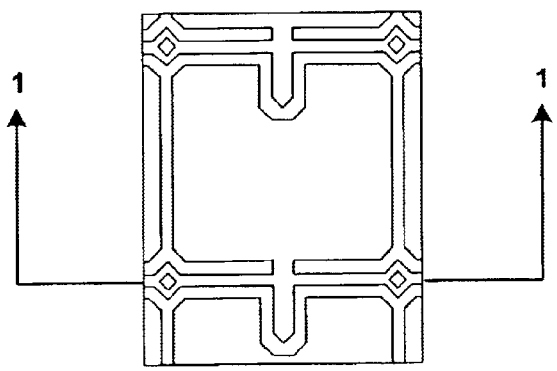
FIG. 2 is a top view of a micro-mirror showing line 1—1 for the cross-sectional views in FIGS. 1A to 1E.
Figure 3A:
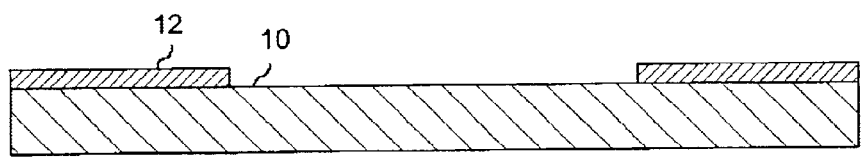
FIGS. 3A to 3E are cross-sectional views illustrating the same method as in FIGS. 1A to 1E but along a different cross-section.
Figure 3B:
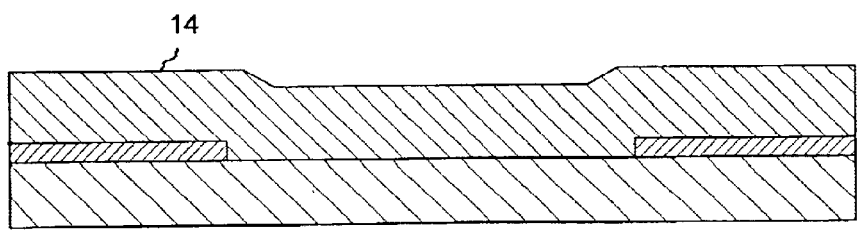
Figure 3C:
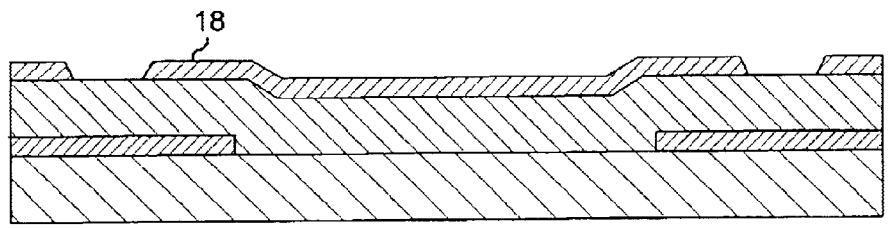
Figure 3D:
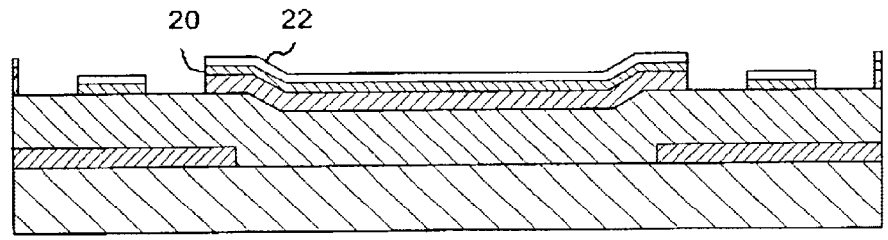
Figure 3E:
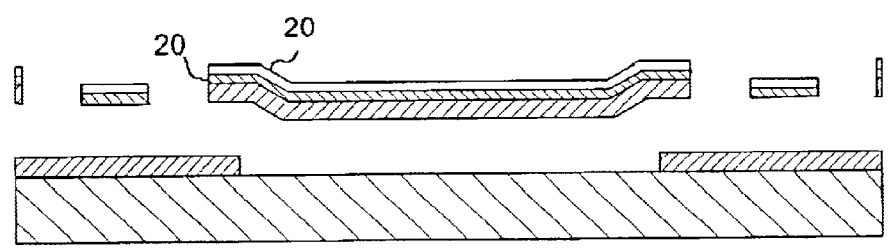
Figure 4:
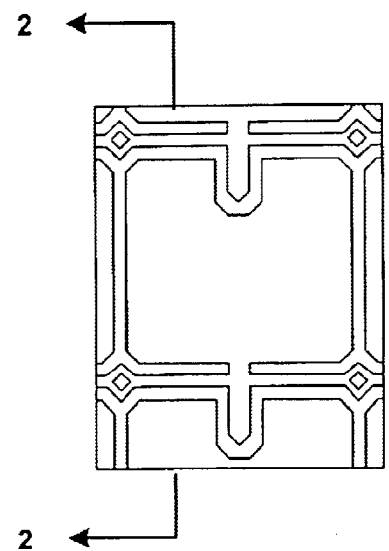
FIG. 4 is a top view of a mirror showing line 2—2 for the cross-section of FIGS. 3A to 3E.

As also shown in FIG. 1D, a reflective and conductive layer 22 is deposited. The reflective/conductive material can be gold, aluminum or other metal, or an alloy of more than one metal though it is preferably aluminum deposited by PVD. The thickness of the metal layer can be from 50 to 2000 Å, preferably around 500 Å. It is also possible to deposit separate reflective and conductive layers. An optional metal passivation layer (not shown) can be added, e.g. a 10 to 1100 Å silicon oxide layer deposited by PECVD. Then, photoresist patterning on the metal layer is followed by etching through the metal layer with a suitable metal etchant. In the case of an aluminum layer, a chlorine (or bromine) chemistry can be used (e.g. a plasma/RIE etch with $Cl_2$ and/or $BCl_3$ (or Cl2, CCl4, Br2, $CBr_4$, etc.) with an optional preferably inert diluent such as Ar and/or He)., The sacrificial layer is then removed in order to "release" the micro-mirror structures (FIG. 1E).

In the embodiment illustrated in FIGS. 1A to 1E, both the first and second layers are deposited in the area defining the movable (mirror) element, whereas the second layer, in the absence of the first layer, is deposited in the area of the hinge. It is also possible to use more than two layers to produce a laminate movable element, which can be desirable particularly when the size of the movable element is increased such as for switching light beams in an optical switch. A plurality of layers could be provided in place of a single layer 18 in FIG. 1C, and a plurality of layers could be provided in place of layer 20 and in place of layer 22. Or, layers 20 and 22 could be a single layer, e.g. a pure metal layer or a metal alloy layer or a layer that is a mixture of e.g. a dielectric or semiconductor and a metal. Some materials for such layer or layers that could comprise of metal alloys and dielectrics or compounds of metals and nitrogen, oxygen or carbon (particularly the transition metals) are disclosed in U.S. patent application 20020047172 to Reid, filed on Jul. 20, 2001, the subject matter of which is incorporated herein by reference.

In one embodiment, the reinforcing layer is removed in the area of the hinge, followed by depositing the hinge layer and patterning both reinforcing and hinge layer together. This joint patterning of the reinforcing layer and hinge layer can be done with the same etchant (e.g. if the two layers are of the same material) or consecutively with different etchants. The reinforcing and hinge layers can be etched with a chlorine chemistry or a fluorine (or other halide) chemistry (e.g. a plasma/RIE etch with $F_2$, $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Of course, if different materials are used for the reinforcing layer and the hinge layer, then a different etchant can be employed for etching each layer. Alternatively, the reflective layer can be deposited before the first (reinforcing) and/or second (hinge) layer. Whether deposited prior to the hinge material or prior to both the hinge material and the reinforcing material, it is preferable that the metal be patterned (e.g. removed in the hinge area) prior to depositing and patterning the hinge material.

FIGS. 3A to 3E illustrate the same process taken along a different cross-section (cross-section 2—2 in FIG. 4) and show the optional block layer 12 deposited on the light transmissive substrate 10, followed by the sacrificial layer 14, layers 18, 20 and the metal layer 22. The cross-sections in FIGS. 1A to 1E and 3A to 3E are taken along substantially square mirrors in FIGS. 2 and 4 respectively. However, the mirrors need not be square but can have other shapes that may decrease diffraction and increase the contrast ratio. Such mirrors are disclosed in U.S. Pat. No. 6,523,961 to Ilkov et al., issued Feb. 25, 2003, the subject matter of which is incorporated herein by reference. The light absorbing material on the light transmissive substrate, as will be discussed below, can be made to conform to the shape of the mirrors—whether the mirrors are formed on the light transmissive substrate or on a semiconductor substrate having circuitry, electrodes and micro-mirrors thereon. Also, the mirror hinges can be torsion hinges as illustrated in this provisional application.

It should also be noted that materials and method mentioned above are examples only, as many other method and materials could be used. For example, the Sandia SUMMiT process (using polysilicon for structural layers) or the Cronos MUMPS process (also polysilicon for structural layers) could be used in the present invention. Also, a MOSIS process (AMI ABN—1.5 um CMOS process) could be adapted for the present invention, as could a MUSiC process (using polycrystalline SiC for the structural layers) as disclosed, for example, in Mehregany et al., Thin Solid Films, v. 355–356, pp. 518–524, 1999. Any suitable deposition and patterning methods can be used, depending upon the structure desired to be deposited. Also, the sacrificial layer and release etchant disclosed herein are exemplary only. For example, a silicon dioxide sacrificial layer could be used and removed with HF (or HF/HCl), or a silicon sacrificial could be removed with ClF3 or BrF3. Also a PSG sacrificial layer could be removed with buffered HF, or an organic sacrificial such as polyimide could be removed in a dry plasma oxygen release step. Of course the release etchant and sacrificial material should be selected depending upon the structural material to be used. Also, though PVD and CVD are referred to above, other thin film deposition methods could be used for depositing the layers, including spin-on, sputtering, anodization, oxidation, electroplating and evaporation.

After forming the micro-mirrors as in FIGS. 1 to 4 on the first wafer, it is preferable to remove the sacrificial layer so as to release the micro-mirrors. This release can be performed at the die level, though it is preferred to perform the release at the wafer level. FIGS. 1E and 3E show the micro-mirrors in their released state. As can be seen in FIG. 1E, posts 24 hold the released microstructure on substrate 10.

Also, though the hinge of each mirror can be formed in the same plane as the mirror element (and/or formed as part of the same deposition step) as set forth above, they can also be formed separated from and parallel to the mirror element in a different plane and as part of a separate processing step. This superimposed type of hinge is disclosed in FIGS. 11 and 12 of the previously-mentioned U.S. Pat. No. 6,046,840, and in more detail in U.S. Pat. No. 6,529,310 to Huibers et al. issued Mar. 4, 2003, the subject matter of which being incorporated herein by reference. Whether formed with one sacrificial layer as in the figures, or two (or more) sacrificial layers as for the superimposed hinge, such sacrificial layers are removed as will be discussed below, with a preferably isotropic etchant. This "release" of the mirrors can be performed immediately following the above described steps, or after shipment from the foundry at the place of assembly.

In one embodiment the resolution is XGA, 1024×768 pixels, though other resolutions are possible. A pixel pitch of from 5 to 24 um is preferred (e.g. 14 um).

Backplane:

The second or "lower" substrate (the backplane) die contains a large array of electrodes on the top metal layer of the die. Each electrode electrostatically controls one pixel (one micro-mirror on the upper optically transmissive substrate) of the microdisplay. The voltage on each electrode on the surface of the backplane determines whether its corresponding microdisplay pixel is optically 'on' or 'off,' forming a visible image on the microdisplay. Details of the backplane and methods for producing a pulse-width-modulated grayscale or color image are disclosed in U.S. Pat. No. 6,388,661 to Richards, issued May 14, 2002, the subject matter of which is incorporated herein by reference. Of course a wide variety of methods for causing actuation of the micro-mirrors are available.

In a preferred embodiment, the display pixels themselves are preferably binary, always either fully 'on' or fully 'off,' and so the backplane design is purely digital. The number of reflective elements (display pixels) in each die can be any number, such as from 6,000 to about 6 million, depending upon the desired resolution of the display. Though the micro-mirrors could be operated in analog mode, no analog capability is necessary. For ease of system design, the backplane's I/O and control logic preferably run at a voltage compatible with standard logic levels, e.g. 5V or 3.3V. To maximize the voltage available to drive the pixels, the backplane's array circuitry may run from a separate supply, preferably at a higher voltage.

One embodiment of the backplane can be fabricated in a foundry 5V logic process. The mirror electrodes can run at 0–5V or as high above 5V as reliability allows. The backplane could also be fabricated in a higher-voltage process such as a foundry Flash memory process using that process's high-voltage devices. The backplane could also be constructed in a high-voltage process with larger-geometry transistors capable of operating at 12V or more. A higher voltage backplane can produce an electrode voltage swing significantly higher than the 5–7V that the lower voltage backplane provides, and thus actuate the pixels more robustly.

In digital mode, it is possible to set each electrode to either state (on/off), and have that state persist until the state of the electrode is changed. A RAM-like structure, with one bit per pixel is an architecture that can accomplish this. One example is an SRAM-based pixel cell. Alternate well-known storage elements such as latches or DRAM (pass transistor plus capacitor) are also possible. If a dynamic storage element (e.g. a DRAM-like cell) is used, it is desirable that it be shielded from incident light that might otherwise cause leakage.

A grayscale or full-color image can be produced by modulating pixels rapidly on and off, for example according to the method in the above-mentioned U.S. Pat. No. 6,388,661 to Richards, issued May 14, 2002 or other suitable methods. In order to support this, it is preferable that the backplane allows the array to be written in random-access fashion, though finer granularity than a row-at-a-time is generally not necessary.

It is desirable to minimize power consumption, primarily for thermal reasons. Decreasing electrical power dissipation will increase the optical/thermal power budget, allowing the microdisplay to tolerate the heat of more powerful lamps. Also, depending upon the way the microdisplay is assembled (wafer-to-wafer join+offset saw), it may be preferable for all I/O pads to be on one side of the die. To minimize the cost of the finished device it is desirable to minimize pin count. For example, multiplexing row addresses or other infrequently-used control signals onto the data bus can eliminate separate pins for these functions with negligible throughput penalties (a few percent, e.g. one clock cycle for address information per row of data is acceptable). A data bus, a clock, and a small number of control signals (5 or less) are all that is necessary.

In use, the die can be illuminated with a 200 W or more arc lamp. The thermal and photo-carrier effects of this may result in special layout efforts to make the metal layers as 'opaque' as possible over the active circuitry to reflect incident optical energy and minimize photocarrier and thermal effects. Also, some light can get between the mirrors or hit the mirror edges, and then scatter from one or more surfaces and end up entering the projection lens/collection optics when the dark state is desired. This has the negative effect of reducing contrast.

To eliminate this scattered light non-reflective material can be placed on the backplane as a final layer. The non-reflective material can be a dark, opaque (e.g. black, grey or other dark color) thin film. Examples of materials that can be placed on backplane to absorb scattered light include a non-conductive blanket film such as polyimide with carbon particles (e.g. DARC™ from Brewer Science). Or other dark colored ceramic films such as CrN, TiAlN, TaN or other films comprising of carbon, such as amorphous CN, amorphous CAlN, TiCN, a-DLC, SiC, TiAlCN, WC, etc.—preferably a non-conductive film can be used. In the alternative, conductive dark films could be used that are placed directly over the electrodes on the backplane and are electrically connected to the electrodes. Such a film could be a dark metal or metal alloy such as sputtered black chrome or niobium that has a reflectance as low as 3%. The black chrome coating can be a multilayer structure of chrome and chromium oxide (to match the index of refraction, as in an antireflective coating laminate). Of course, other opaque films (preferably those with high optical density, thermally stable and with low reflectivity) can be deposited and patterned (the opacity and color of many films being variable due to deposition parameters). Light absorbing conductive materials that can be deposited on the electrodes include black nickel, and films comprising carbon, such as a-DLC or vitreous carbon. It is also possible to deposit a dark conductive grid or matrix surrounding all of the electrodes (without electrically connecting the electrodes).

It is also possible to put an "anti-reflective coating" (an AR film) on the backplane. For example a normally absorptive surface can have enhanced absorption if an "AR film" stack (for example light transmissive dielectric layers), are placed above it so that light reflection is reduced due to destructive interference. Such dielectrics layers can be designed to work particularly well at certain wavelengths and/or angles—and can be used for the matrix or frame on the light transmissive substrate, as will be discussed below.

Assembly

Figure 5:
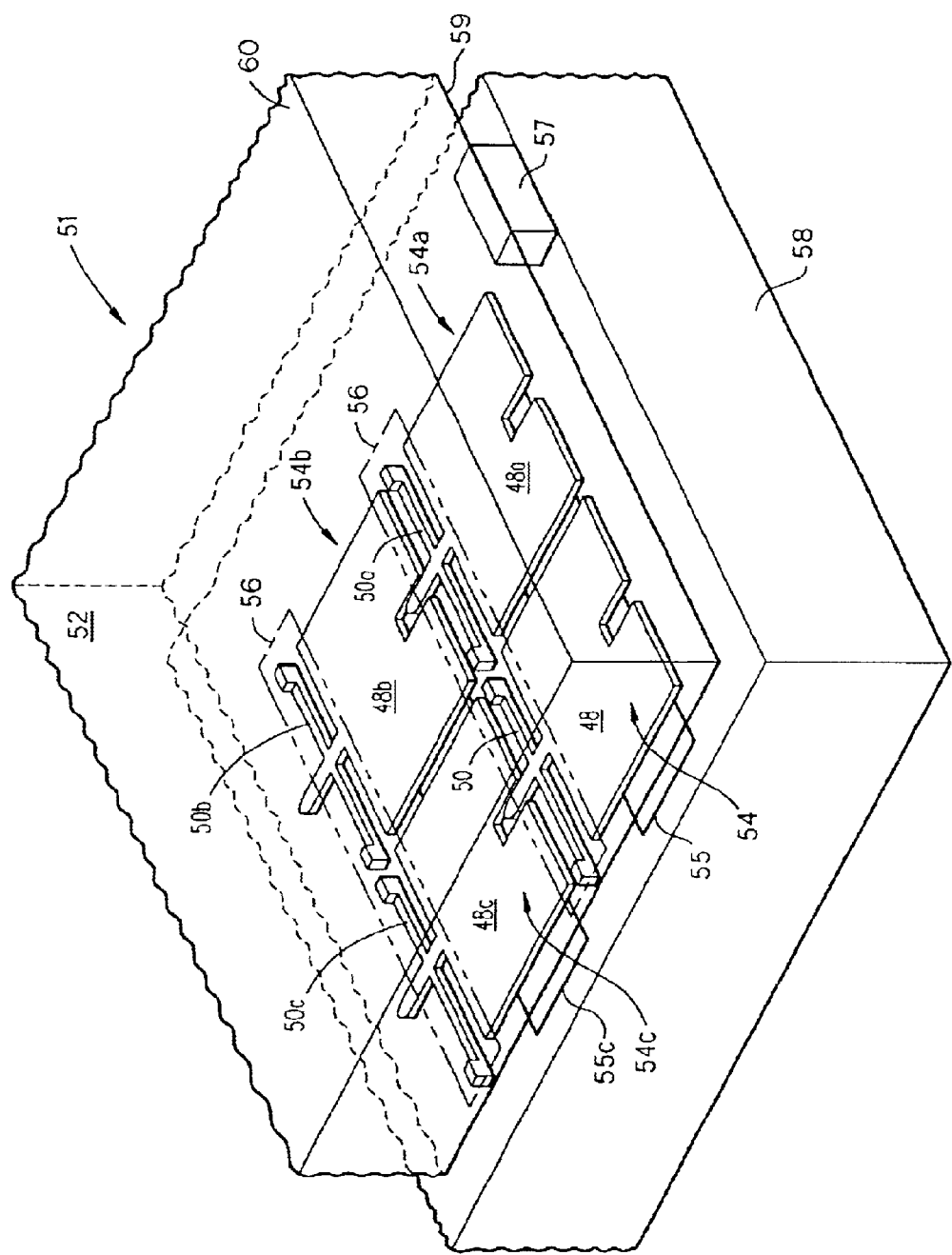
FIG. 5 is an isometric view of the assembly of two substrates, one with micromirrors, the other with circuitry and electrodes.
Figure 6:
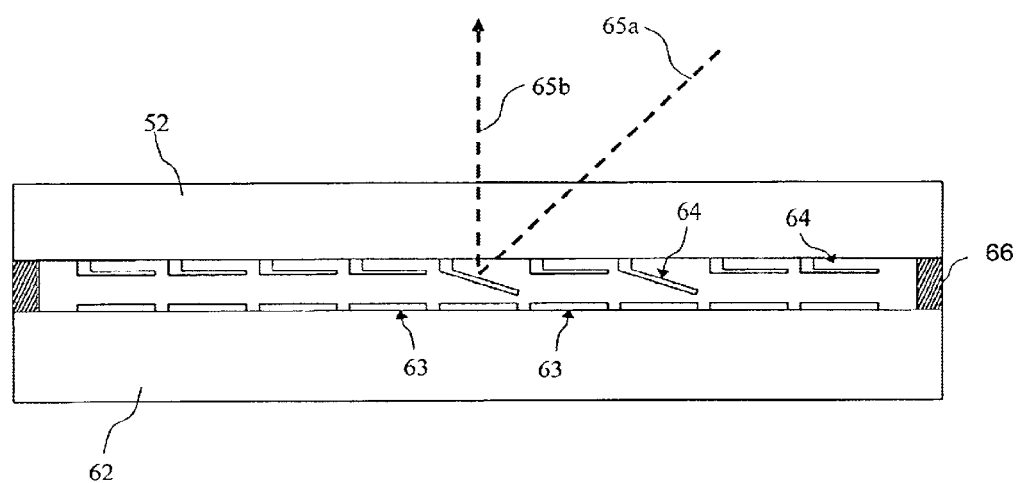
FIG. 6 is a cross-sectional view of the assembled device in use.

After the upper and lower substrates (wafers) are finished being processed (e.g. circuitry/electrodes on lower wafer, micro-mirrors on upper wafer), the upper and lower wafers are joined together. This joining of the two substrates allows micro-mirrors on one substrate to be positioned proximate to electrodes on the other substrate. This arrangement is illustrated in FIGS. 5 and 6, which will be described further below.

The method for the assembly of the wafers and separation of the wafer assembly into individual dies is similar to the method for assembly of liquid crystal devices as disclosed in U.S. Pat. No. 5,963,289 to Stefanov et al, "Asymmetrical Scribe and Separation Method of Manufacturing Liquid Crystal Devices on Silicon Wafers", which is hereby incorporated by reference. Many bonding methods are possible such as adhesive bonding (e.g. epoxy, silicone, low K material or other adhesive—described further herein), anodic bonding, compression bonding (e.g. with gold or indium) metal eutectic bonding, solder bonding, fusion bonding, or other wafer bonding processes known in the art. Whether the upper and lower wafer are made of the same or different materials (silicon, glass, dielectric, multilayer wafer, etc.), they can first be inspected (step 30 in the flow chart of FIG. 7) for visual defects, scratches, particles, etc. After inspection, the wafers can be processed through industry standard cleaning processes (step 32 in the flow chart of FIG. 7). These include scrubbing, brushing or ultrasonic cleaning in a solvent, surfactant solution, and/or de-ionized (DI) water.

Figure 7:
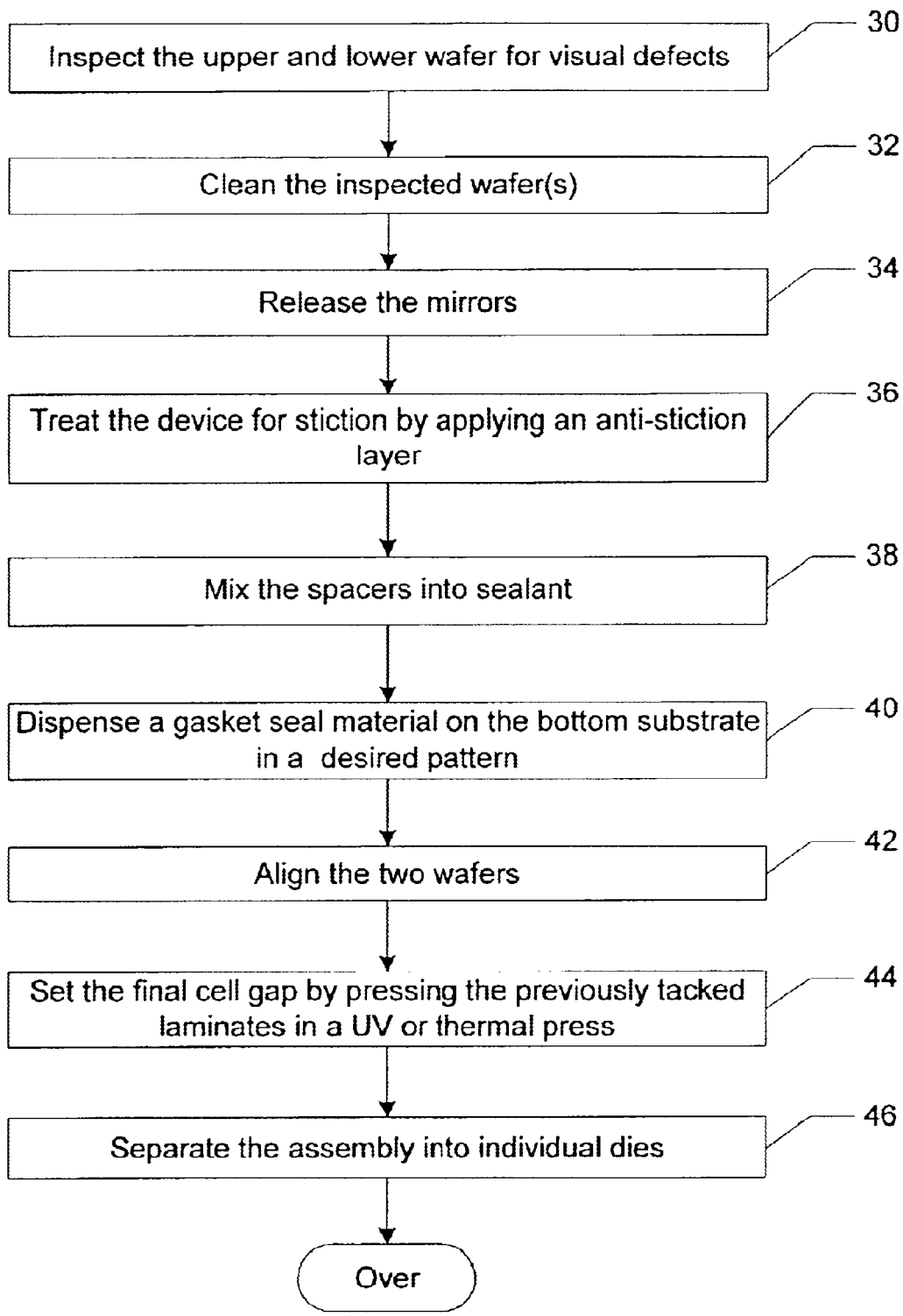
FIG. 7 is a flow chart of one method of the invention.

The mirrors are preferably released at this point (step 34 in the flow chart of FIG. 7). Releasing immediately prior to the application of epoxy or bonding is preferable (except for an optional stiction treatment between release and bonding). For silicon sacrificial layers, the release can be in an atmosphere of xenon difluoride and an optional diluent (e.g. nitrogen and/or helium). Of course, other etchants could be used, including interhalogens such as bromine trifluoride and bromine trichloride. The release is preferably a spontaneous chemical etch which does not require plasma or other external energy to etch the silicon sacrificial layer(s). Or the release can be performed with a supercritical fluid such as set forth in US patent application 20030047533 filed Jun. 10, 2002, incorporated herein by reference. After etching, the remainder of the device is treated for stiction (step 36 in the flow chart of FIG. 7) by applying an anti-stiction layer (e.g. a self assembled monolayer). The layer is preferably formed by placing the device in a liquid or gas silane, preferably a halosilane, and most preferably a chlorosilane. Of course, many different silanes are known in the art for their ability to provide anti-stiction for MEMS structures, including the various trichlorsilanes set forth in "Self Assembled Monolayers as Anti-Stiction Coatings for MEMS: Characteristics and Recent Developments", Maboudian et al., as well as other unfluorinated (or partially or fully fluorinated) alkyl trichlorosilanes, preferably those with a carbon chain of at least 10 carbons, and preferably partially or fully fluorinated. (Tridecafluoro-1,1,2,2-tetrahydro-octyl)trichlorosilane available from Gelest, Inc. is one example. Other trichlorosilanes (preferably fluorinated) such as those with phenyl or other organic groups having a ring structure are also possible.

In order to bond the two wafers together, spacers are mixed into sealant material (step 38 in the flow chart of FIG. 7). Spacers in the form of spheres or rods are typically dispensed and dispersed between the wafers to provide cell gap uniformity and space for mirror deflection. Spacers can be dispensed in the gasket area of the display and therefore mixed into the gasket seal material prior to seal dispensing. This is achieved through normal agitated mixing processes. The final target for the gap between the upper and lower wafers is preferably from 1 to 10 um, though other gaps are possible depending upon factors such as micro-mirror size and deflection angle. The spheres or rods can be made of glass or plastic, preferably an elastically deforming material. Alternatively, spacer pillars can be fabricated on at least one of the substrates. In one embodiment, pillars/spacers are provided only at the side of the array. In another embodiment, pillars/spacers can be fabricated in the array itself. Other bonding agents with or without spacers could be used, including anodic bonding or metal compression bonding with a patterned eutectic or metal.

A gasket seal material can then be dispensed (step 40 in the flow chart of FIG. 7) on the bottom substrate in a desired pattern, usually in one of two industry standard methods including automated controlled liquid dispensing through a syringe and printing (screen, offset, or roller). When using a syringe, it can be moved along X-Y coordinates relative to the parts. The syringe tip is constrained to be just above the part with the gasket material forced through the needle by positive pressure. Positive pressure can be provided either by a mechanical plunger forced by a gear driven configuration and/or by an air piston and/or pressed through the use of an auger. Of course many different adhesive dispensing methods can be used.

Then, the two wafers are aligned (step 42 in the flow chart of FIG. 7)—preferably to within 1 micron accuracy or less. Alignment of the opposing electrodes or active viewing areas is aided by registration of substrate fiducials on opposite substrates. This task can be accomplished with the aid of video cameras with lens magnification. The machines range in complexity from manual to fully automated with pattern recognition capability. Whatever the level of sophistication, they preferably accomplish the following: (a) Dispense a very small amount of a UV curable adhesive at locations near the perimeter and off of all functional devices in the array; (b) Align the fiducials of the opposing substrates within the equipment capability; and (c) Press substrates and UV tack for fixing the wafer-to-wafer alignment through the remaining bonding process (e.g., curing of the internal epoxy).

The final cell gap can be set by pressing (step 44 in the flow chart of FIG. 7) the previously tacked laminates in a UV or thermal press. In a UV press, a common procedure would have the substrates loaded into a press where at least one or both of the press platens are quartz, in order to allow UV radiation from a UV lamp to pass unabated to the gasket seal epoxy. Exposure time and flux rates are process parameters determined by the equipment and adhesive materials. Thermally cured epoxies require that the top and bottom platens of a thermal press be heated. The force that can be generated between the press platens is typically many pounds. With thermally cured epoxies, after the initial press the arrays are typically transferred to a stacked press fixture where they can continually to be pressed and post-cured for 4–8 hours.

Once the wafers have been bonded together to form a wafer assembly, the assembly can be separated into individual dies (step 46 in the flow chart of FIG. 7). Silicon substrate and glass scribes are placed on the respective substrates in an offset relationship at least along one direction. Or, the substrates can be provided initially with scribes on them already. The units are then separated, resulting in each unit having a bond pad ledge on one side and a glass electrical contact ledge on an opposite side—if such an offset arrangement is desired. The parts may be separated from the array by any of the following methods. The order in which the array (glass first) substrate is scribed is important when conventional solid-state cameras are used for viewing and alignment in a scribe machine. This constraint exists unless special infrared viewing cameras are installed which make the silicon transparent and therefore permits viewing of front surface metal fiducials. The scribe tool is aligned with the scribe fiducials and processed. The resultant scribe lines in the glass can be used as reference marks to align the silicon substrate scribe lanes. These scribe lanes may be coincident with the glass substrate scribes or uniformly offset. The parts are then separated from the array by venting the scribes on both substrates. Automatic breaking is done by commercially available guillotine or fulcrum breaking machines. The parts can also be separated by hand. Or, any other suitable singularization method can be used to separate the bonded wafers into bonded wafer die portions.

For example, separation may also be done by glass scribing and partial sawing of the silicon substrate. Sawing requires an additional step at gasket dispense. Sawing can be performed in the presence of a high-pressure jet of water. Moisture should preferably not be allowed in the area of the fill port or damage of the MEMS structures could occur. Therefore, at gasket dispense, an additional gasket bead must be dispensed around the perimeter of the wafer. The end of each scribe/saw lane must be initially left open, to let air vent during the align and press processes. After the array has been pressed and the gasket material cured, the vents are then closed using either the gasket or end-seal material. The glass is then aligned and scribed as described above. Sawing of the wafer is done from the backside of the silicon where the saw streets are aligned relative to the glass scribe lanes described above. The wafer is then sawed to a depth of 50%–90% of its thickness. The parts are then separated as described above.

Alternatively, both the glass and silicon substrates may be partially sawed prior to part separation. With the same gasket seal configuration, vent and seal processes as described above, saw lanes are aligned to fiducials on the glass substrates. The glass is sawed to a depth between 50% and 95% of its thickness. The silicon substrate is sawed and the parts separated as described above.

Figure 8:
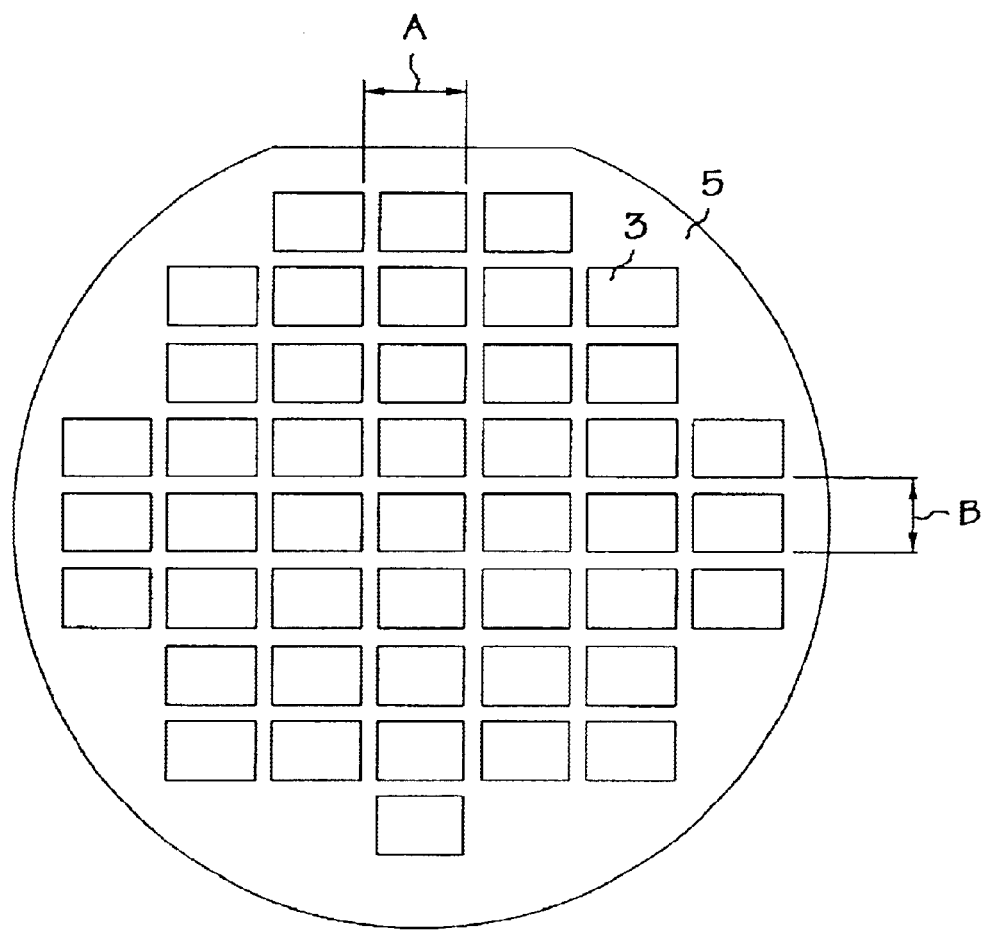
FIG. 8 is a top view of a wafer substrate having multiple die areas.

For an illustrated example of the above, reference is made to FIG. 8 where 45 die areas have been formed on wafer 5. Each die area 3 (having a length A and a height B) comprises one or more (preferably released) micro-mirrors. In the case of micro-mirror arrays for projection systems, each die preferably has at least 1000 movable mirrors, and more likely between 1 and 6 million movable elements.

Figure 9A:
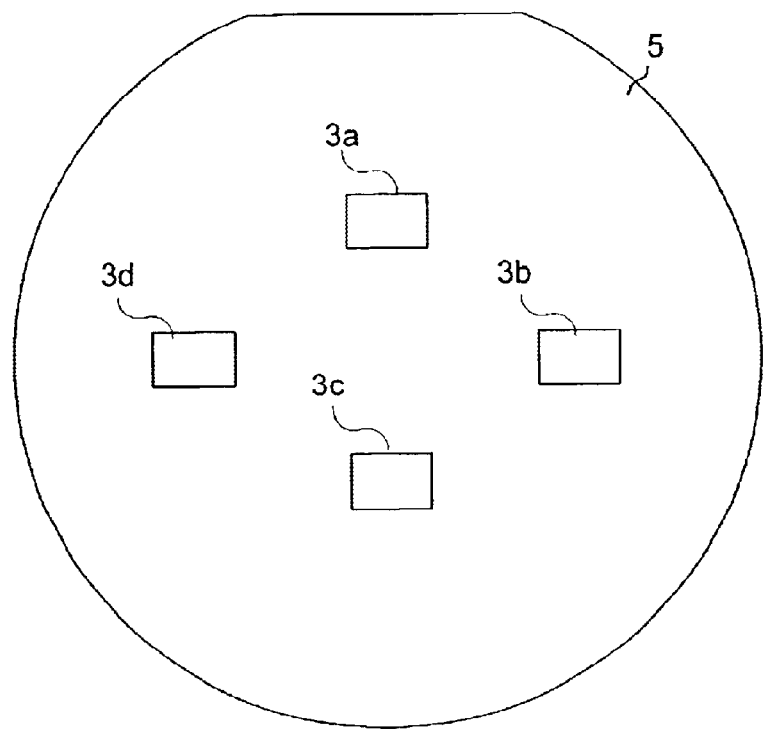
Figure 9B:
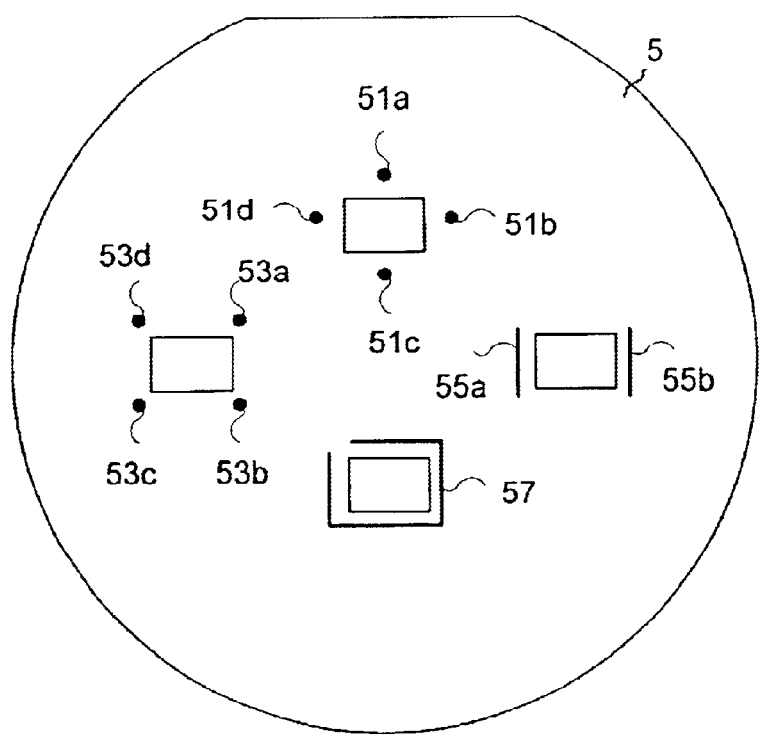

As can be seen in FIG. 9A, four die areas 3a to 3d are formed on wafer 5 (many more dies would be formed in most circumstances, though only four are shown for ease of illustration). Each die area 3a to 3d comprises one or more micro-mirrors, which have already been released in a suitable etchant. As illustrated in FIG. 9B, epoxy can be applied in the form of beads 51a to 51d along each side of the die area, or as beads 53a to 53d at each corner of the die area. Or, epoxy ribbons 55a and 55b could be applied along two sides of each die, or a single ribbon 57 could be applied substantially surrounding an entire die. Of course many other configurations are possible, though it is desirable that the die not be fully surrounded with an epoxy gasket, as this will prevent air or other gas from escaping when the two wafers are pressed together during a full or partial epoxy cure. And, of course, it is preferable, for higher manufacturing throughput, to use a common epoxy application method throughout the entire wafer (the different types of applications in FIG. 9B are for illustrations purposes only). Also, the areas in which epoxy is applied can first have a sacrificial material deposited in that area (preferably in an area larger than the bead or band of epoxy due to expansion of the epoxy under compression). The sacrificial material could also be applied to the entire wafer except in areas having micro-mirrors thereon. Also, a conductive epoxy (or other adhesive) could be used in order to make electrical contact between the wafer having circuitry and electrodes and the wafer having MEMS thereon.

Figure 9C:
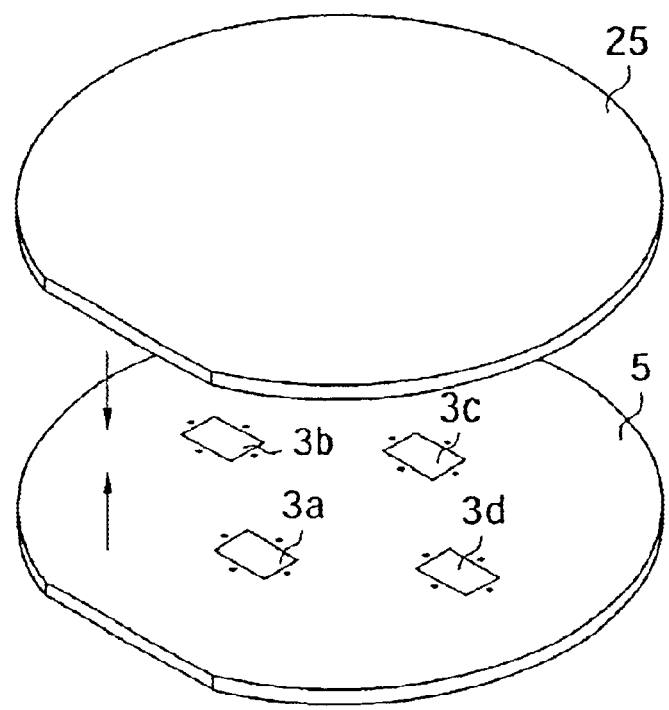

In FIG. 9C, upper wafer 25 and the lower substrate wafer 5 with micromirrors (and optionally circuitry) are brought into contact with each other. The final gap between the two wafers can be any size that allows the two wafers to be held together and singularized uniformly. Because gasket beads will expand upon application of pressure (thus taking up valuable real estate on a wafer with densely positioned die areas), it is preferable that the gap size be larger than 1 um, and preferably greater than 10 um. The gap size can be regulated by providing microfabricated spacers or spacers mixed in with the epoxy (e.g. 25 um spacers). However, spacers may not be necessary depending upon the type of microstructure and the amount of pressure applied.

Figure 9D:
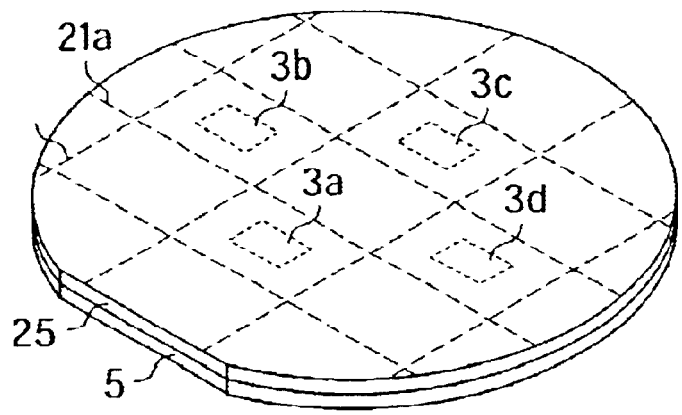
Figure 9E:
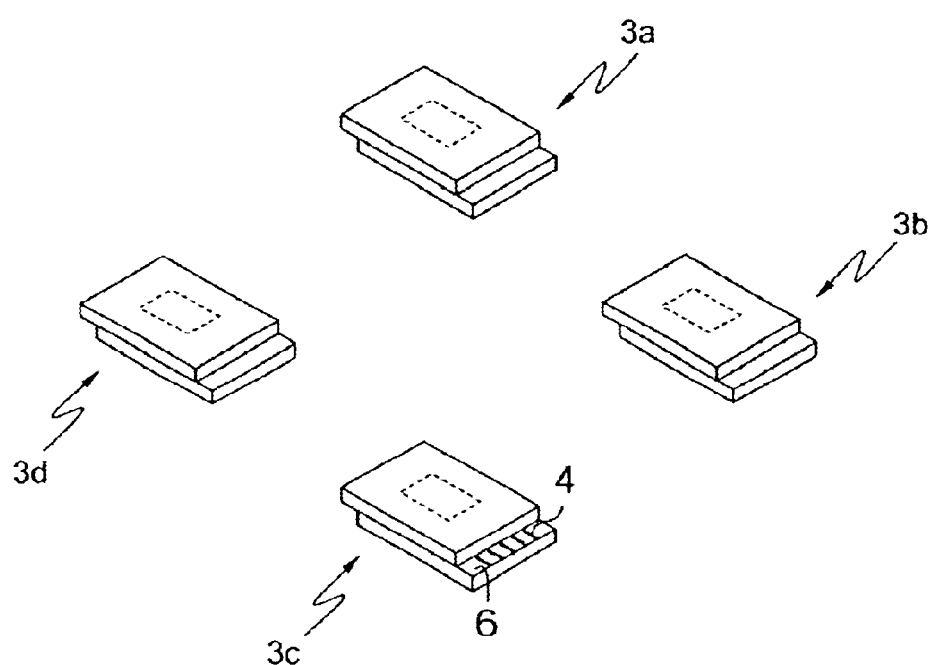

FIG. 9D shows the lower wafer 5 and upper wafer 25 bonded together. Horizontal and vertical score or partial saw lines 21a and 21b are provided on both the upper wafer 25 and the first (lower) wafer 5 (lines not shown on wafer 5). Preferably the score lines on the two wafers are offset slightly from each other at least in one of the (horizontal or vertical). This offset scoring or partial sawing allows for ledges on each die when the wafer is completely singularized into individual dies (see FIG. 9E). Electrical connections 4 on ledge 6 on die 3c allow for electrical testing of the die.

Referring again to FIG. 5, a top perspective view of a portion of a bonded wafer assembly die 10 is illustrated. Of course, the mirror shapes illustrated in FIGS. 1 to 5 are exemplary, as many other mirror structures are possible, such as set forth in U.S. patent application Ser. No. 09/732, 445 (now U.S. Pat. No. 6,523,961 issued Feb. 25, 2003) to Ilkov et al. filed Dec. 7, 2000, incorporated herein by reference. For clarity, only four pixel cells 54, 54a, 54b and 54c in a two by two grid configuration are shown in FIG. 5. The pixel cells 54, 54a, 54b and 54c have a pixel pitch of, for example, 12 microns. "Pixel pitch" is defined as the distance between like portions of neighboring pixel cells.

Reflective deflectable elements (e.g., mirrors 48, 48a, 48b and 48c), each corresponding to a respective pixel cell 54, 54a, 54b and 54c, are attached to the lower surface 14 of the optically transmissive substrate 52 in an undeflected position. Thus, mirrors 48, 48a, 48b and 48c are visible through optically transmissive substrate 52 in FIG. 5. For clarity, light blocking aperture layers 56 if present, between the mirrors 48, 48a, 48b or 48c and the optically transmissive substrate 52, are represented only by dashed lines so as to show underlying hinges 50, 50a, 50b and 50c. The distance separating neighboring mirrors may be, for example, 0.5 microns or less.

The optically transmissive substrate 52 is made of materials, which can withstand subsequent processing temperatures. The optically transmissive substrate 52 may be, for example, a 4 inch quartz wafer 500 microns thick. Such quartz wafers are widely available from, for example, Hoya Corporation U.S.A at 960 Rincon Circle, San Jose, Calif. 95131. Or, the substrate can be glass such as Corning 1737 or Corning Eagle2000 or other suitable optically transmissive substrate. In a preferred embodiment, the substrate is transmissive to visible light, and can be display grade glass.

Figure 13:
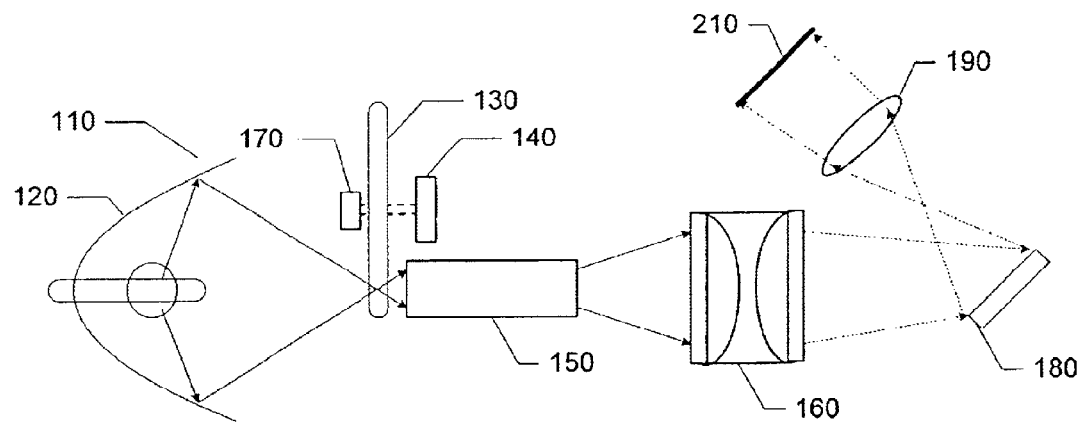
FIG. 13 is an illustration of a projection system having a micro-mirror device therein.

As can be seen in FIG. 6, the light transmissive substrate 52 is bonded to e.g. a MOS-type substrate 62 (a semiconductor substrate can be used such as a silicon substrate with circuitry and electrodes formed thereon) in spaced apart relation due to spacers 66. A plurality of electrodes 63 are disposed adjacent a plurality of micro-mirrors 64 (mirrors simplified and only 9 illustrated for convenience) for electrostatically deflecting the micromirrors. An incoming light beam 65a will be reflected by a non-deflected mirror at the same angle as it is incident, but will be deflected "vertically" as outgoing light beam 65b when the mirror is deflected. An array of thousands or millions of mirrors selectively moving and deflecting light "vertically" toward projection optics, along with a color sequencer (wheel or prism) that directs sequential beams of different colors onto the mirrors, results in a color image projected on a target (e.g. for projection television, boardroom projectors, etc.). A simplified schematic of one type of projection system is illustrated in FIG. 13, where a light source 110, e.g. an arc lamp having a reflector 120, directs light through a color sequencer (e.g. color wheel 130 that rotates around axis of rotation 170 via motor 140), after which the light enters light pipe 150 and optics 160 so as to be incident on a micro-mirror array 180 and is reflected off of the micro-mirrors of the array and projected via projection optics 190 to a target 210.

The method for forming micro-mirrors as set forth above is but one example of many methods for forming many different MEMS devices (whether with or without an electrical component), in accordance with the present invention. Though the electrical component of the final MEMS device is formed on a separate wafer than the micro-mirrors in the above example, it is also possible to form the circuitry and micro-mirrors monolithically on the same substrate. The method for forming such micro-mirrors could be similar to the methods described herein (with the difference being that the mirrors are formed on the substrate after forming circuitry and electrodes). Or, other methods for forming circuitry and micro-mirrors monolithically on the same substrate as known in the art could be used.

Figure 10A:
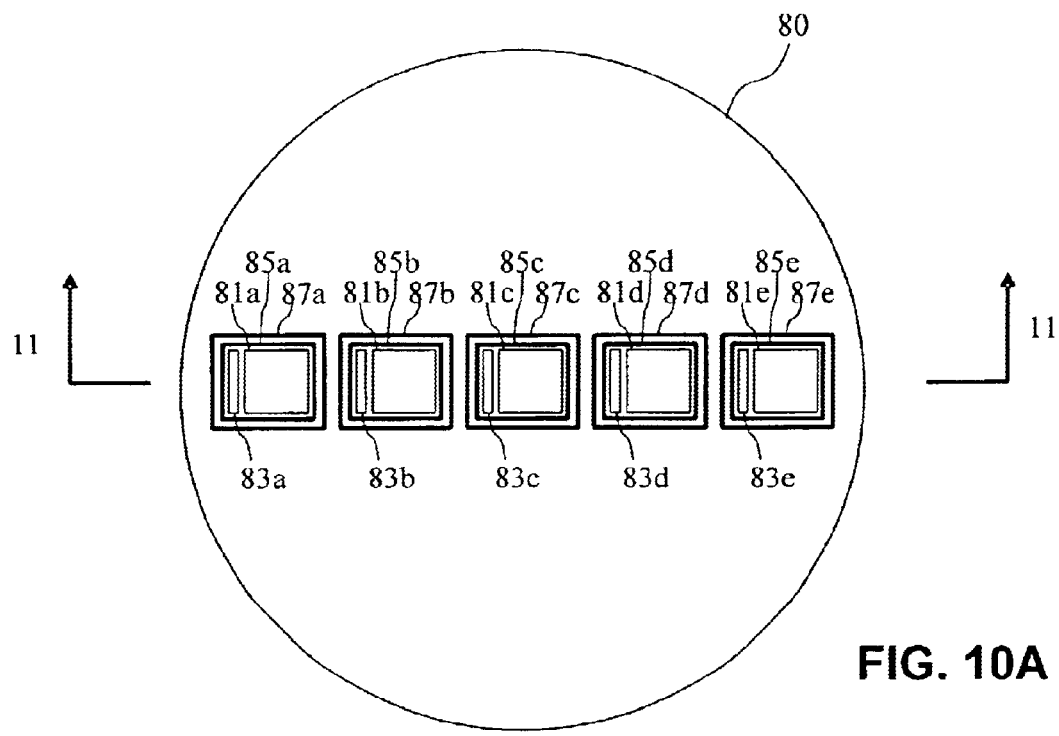
FIGS. 10A and 10B are top views of two wafers that will be joined together and then singularized.
Figure 10B:
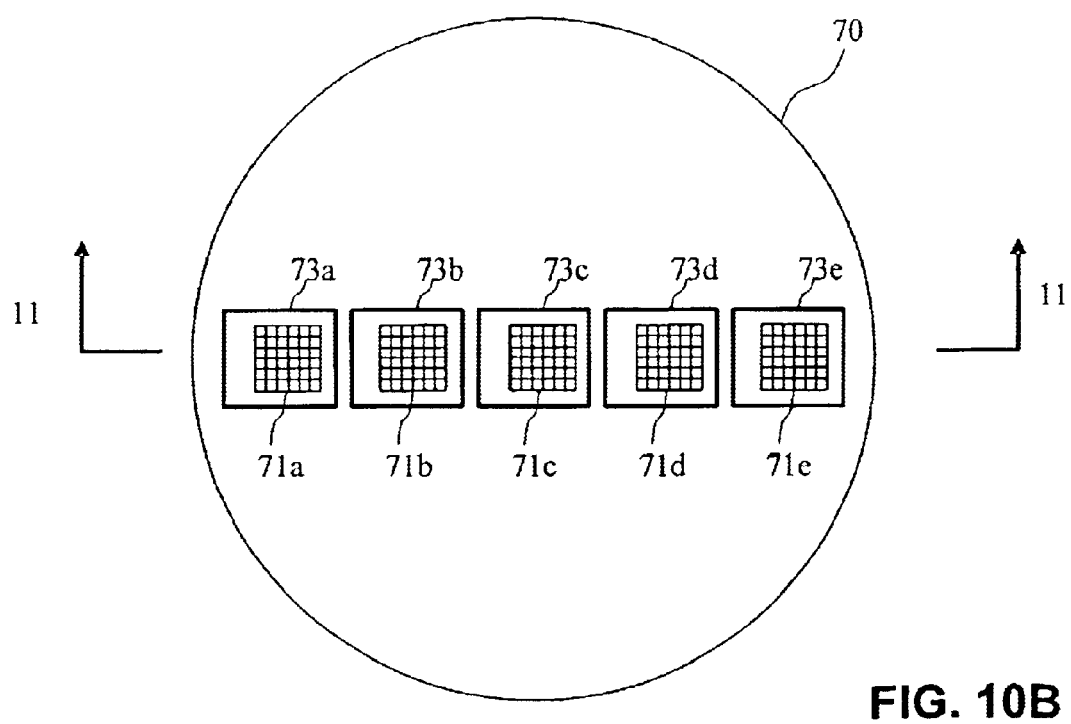

FIGS. 10A and 10B show two wafers that will be joined together and then singularized. FIG. 10A is a top view of a light transmissive cover wafer (having a mask area, getter area, lubricant area and compression metal bonding area) whereas FIG. 10B is an illustration of such a monolithically formed mirror array (e.g. for a spatial light modulator) on a bottom semiconductor wafer (along with a metal area for compression bonding). Referring first to FIG. 10B, a plurality of mirror arrays 71a to 71e is formed on a "bottom" wafer 70 (e.g. a silicon wafer). After the mirrors are released, a metal for compression bonding is applied (areas 73a to 73e) around each mirror array. Of course more arrays could be formed on the wafer (as shown in FIG. 8). On a "top" wafer 80 (e.g. glass or quartz—preferably display grade glass) are formed masks 81a–e, which will block visible light around a perimeter area of each die from reaching the mirror arrays after the two wafers are bonded and singularized. Also illustrated in FIG. 10A are areas of lubricant 83a–e, areas of getter material 85a–e, and areas of metal for compression bonding 87a–e. If the wafer of FIG. 10B has been treated with a self assembled monolayer or other lubricant, then the addition of a lubricant on the wafer of FIG. 10A may be omitted if desired (although multiple applications of lubricants can be provided). The lubricant applied to the wafer as a gasket, band or drop on the wafer, can be any suitable lubricant, such as the various liquid or solid organic (or hybrid organic-inorganic materials) as known in the art. In one embodiment, a trichlorosilane SAM is applied to the entire wafer or large portions of the wafer at least covering the micro-mirror elements, and a silicone is applied to the lubricant areas 83a–e. The metal for compression bonding could be any suitable metal for this purpose such as gold or indium. (Alternatively, if an adhesive is used, the adhesive could be any suitable adhesive, such as an epoxy or silicone adhesive, and preferably an adhesive with low outgassing). Of course any combination of these elements could be present (or none at all if the bonding method is other than an adhesive bonding method). Preferably one or more of the mask, lubricant, getter and bonding material are present on the "top" wafer 80 prior to bonding. Also, the lubricant, getter and bonding material could be applied to only the top or bottom wafer or both wafers. In an alternate embodiment, it may be desirable to apply the lubricant and getter to the bottom wafer around the circuitry and electrodes, with bonding material on both wafers. Of course, depending upon the MEMS application, the mask (or the lubricant or getter) may be omitted (e.g. for non-display applications). Also, the bands of lubricant, getter and bonding material need not fully encircle the "die area" on the wafer, but could be applied in strips of dots as illustrated in FIG. 9B. If the bonding material does not fully encircle the MEMS die area, then, prior to singulation, it is preferred that the bonding material "gap" be filled so as to protect the MEMS devices during singulation (from particulate and/or liquid damage depending upon the singulation method).

Figure 10C:
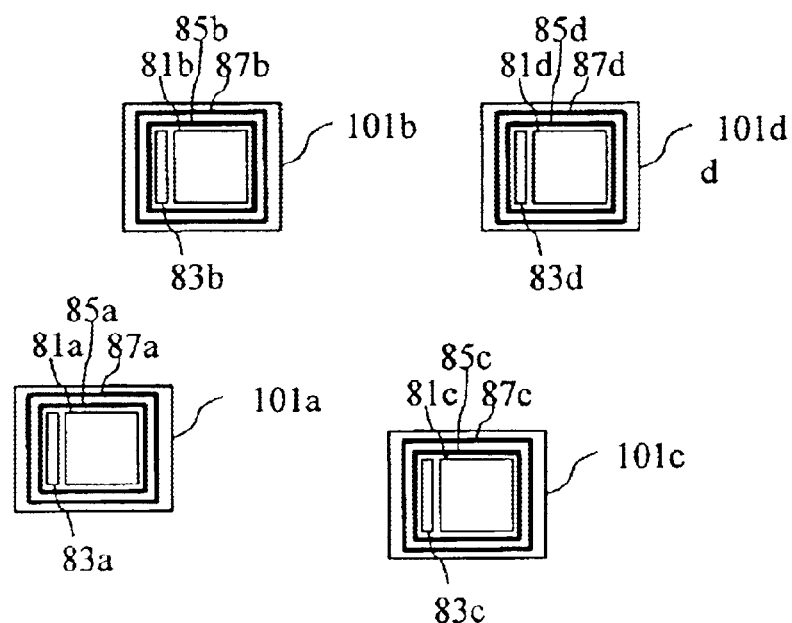
FIGS. 10C and 10D are views of light transmissive substrates (FIG. 10A) for bonding to a wafer (10D)
Figure 10D:
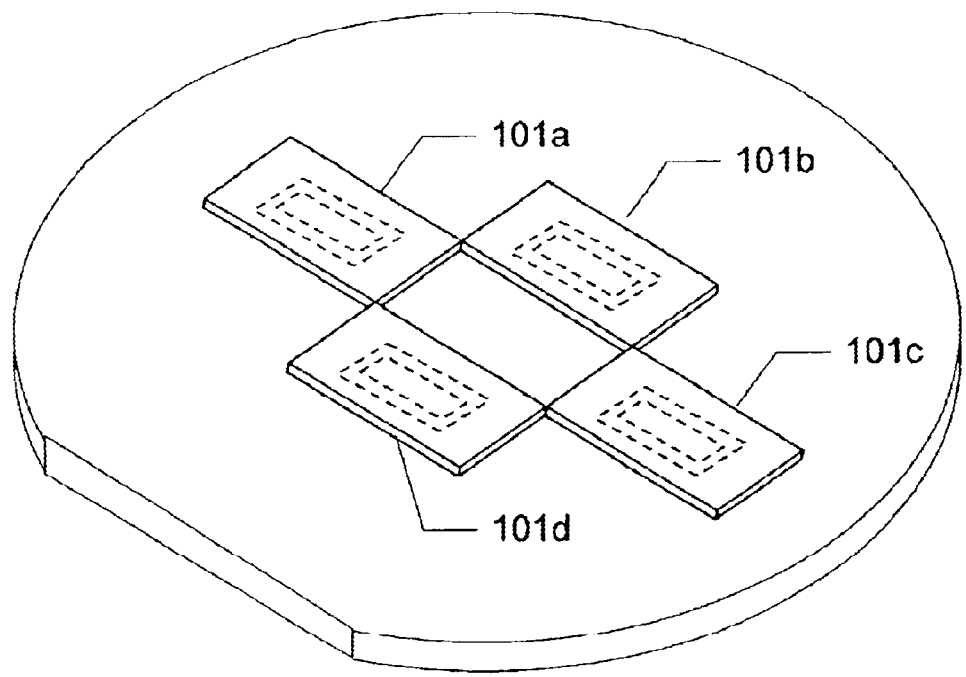

It is also possible to bond multiple substrates (smaller than a single wafer) to another wafer. In the embodiment illustrated in FIGS. 10C and 10D, substrates 101a to 101d are substrates transmissive to visible light and have thereon masks 81a to 81d as well as areas of lubricant 83a to 83d, areas of getter material 85a to 85d, and areas of bonding material 87a to 87d (e.g. gold or indium for metal compression bonding. The mask areas are preferably "picture frame" shaped rectangular areas that block the transmission of visible light. This arrangement is desirable for selectively blocking light incident on micro-mirror arrays formed on the wafer. After bonding the multiple substrates with mask areas to the wafer, the wafer is singularized into wafer assembly portions, followed by packaging such as in FIG. 12.

The MEMS wafers could be made of any suitable material, depending upon the final application for the devices, including silicon, glass, quartz, alumina, GaAs, etc. Silicon wafers can typically be processed to include circuitry. For an optical MEMS application (e.g. micro-mirrors for optical switching or for displays), the "top" wafer of FIG. 10A is preferably transparent, as mentioned above. The mask illustrated in FIG. 10A, can be an absorptive or reflective mask, such as one made from TiN, AlN, or other oxide or nitride compound, or polymers or other suitable materials having sufficient light absorbing capabilities. This "top" wafer could also incorporate other optical elements, such as lenses, UV or other types of filters or antireflection and/or antiscratch coatings.

Figure 11A:
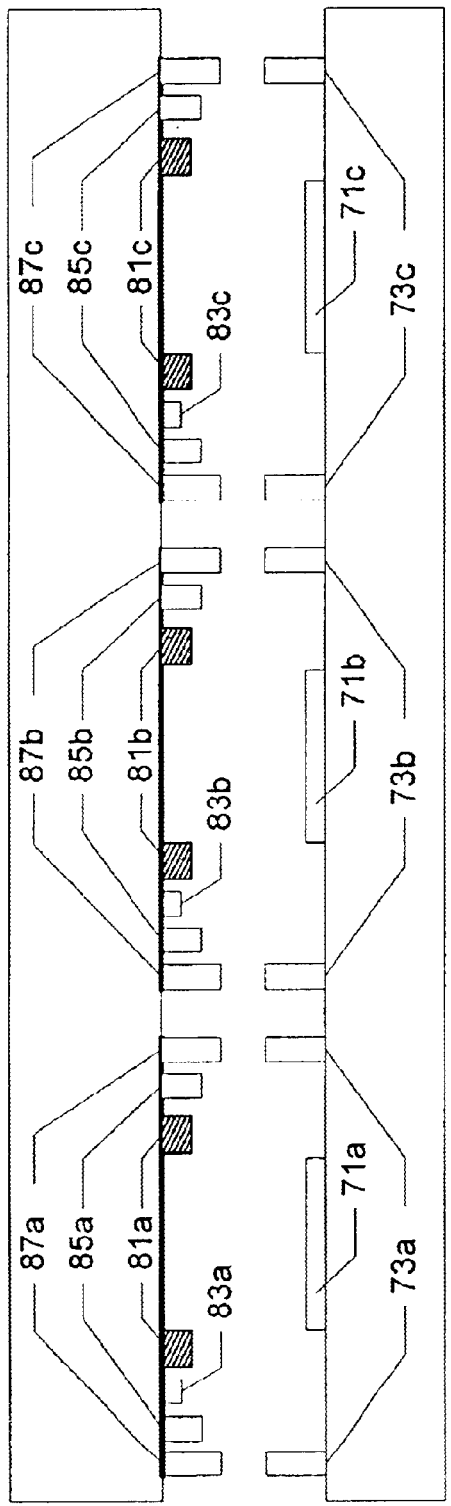
FIG. 11A is a cross-sectional view taken along line 11—11 of FIG. 10 upon alignment of the two wafers of FIGS. 10A and 10B, but prior to bonding.
Figure 11B:
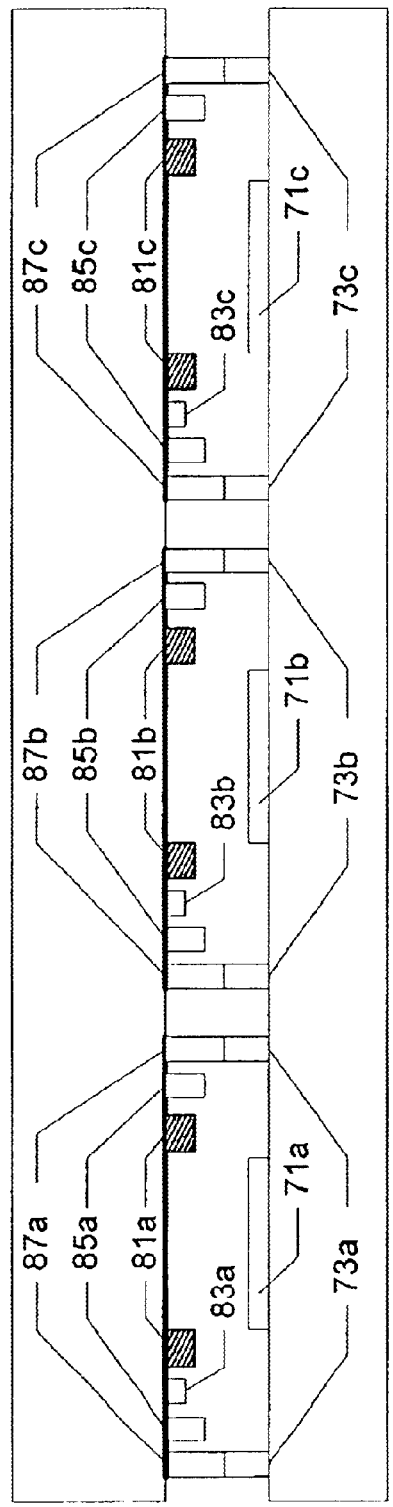
FIG. 11B is a cross-sectional view taken along line 11—11 of FIG. 10 upon alignment of the two wafers of FIGS. 10A and 10B after bonding the two wafers, but prior to singulation.
Figure 12:
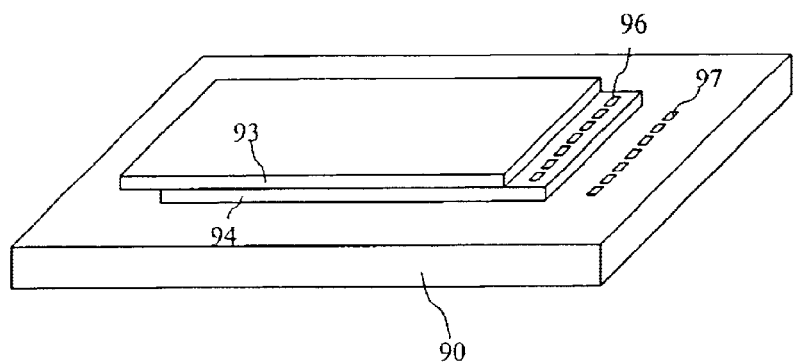
FIG. 12 is an isometric view of a singularized wafer assembly die held on a package substrate.

Then, the two wafers are aligned, bonded, cured (e.g. with UV light or heat depending upon the type of adhesive used) and singularized as set forth above. FIG. 11A is a cross-section taken along line 11—11 in FIG. 10A (after alignment with bottom wafer 70 in FIG. 10B), whereas FIG. 10B is the same cross-section after bonding (but before singulation). FIG. 12 is an illustration of a packaged wafer assembly portion after singularization of the bonded wafers. As can be seen in FIG. 12, a lower substrate 94 is bonded to the upper substrate 93, with the lower substrate held on a lower packaging substrate 90. Metal areas 96 on lower wafer portion 94 will be electrically connected to metal areas 97 on the package substrate 90. As can be seen in this Figure, unlike other MEMS packaging configurations, there is no need to further encapsulate or package the wafer assembly die formed of substrates 93 and 94, as the MEMS elements are already protected within the wafer assembly (though a "second" package surrounding the substrate assembly could be used for added protection and hermeticity). As such, the die comprised of two-bonded die substrates (light transmissive and semiconductor, for example, with MEMS elements on the light transmissive substrate) seal (preferably hermetically) the MEMS elements from ambient. A micro-mirror array comprised of micro-mirrors held on a first substrate (preferably glass and more preferably display quality glass) which substrate is bonded to a semiconductor substrate (preferably silicon) which in turn is bonded to a lower package substrate that does not fully encapsulate the bonded die substrates (because the light transmissive and semiconductor substrates already encapsulate the MEMS elements) is a less expensive alternative to standard packaging of micro-mirror arrays for projection displays. Also, such a packaging arrangement allows for providing anti-stiction treatment, getters etc. at the wafer level further decreasing costs of packaging the device. Of course, an additional package surrounding the substrate assembly could also be used.

Alternatively, it is possible to fully encapsulate the two bonded die substrates within a fully surrounding package (having an optically transmissive window for light to enter and exit the package). Such a fully surrounding package could be a hermetic package with, for example, a pressure less than ambient pressure. The pressure between the bonded die substrates hermetically sealed together can be less than 1 atm, preferably less than 0.25 atm, and more preferably less than Torr. If very low pressures are desired, then pressures between the substrates of less than 10 Torr, less than 1 Torr or even as low as 100 mTorr can be used. Getters, lubricants, etc. could be disposed within this surrounding package rather than within the bonded substrates.

Figure 15:
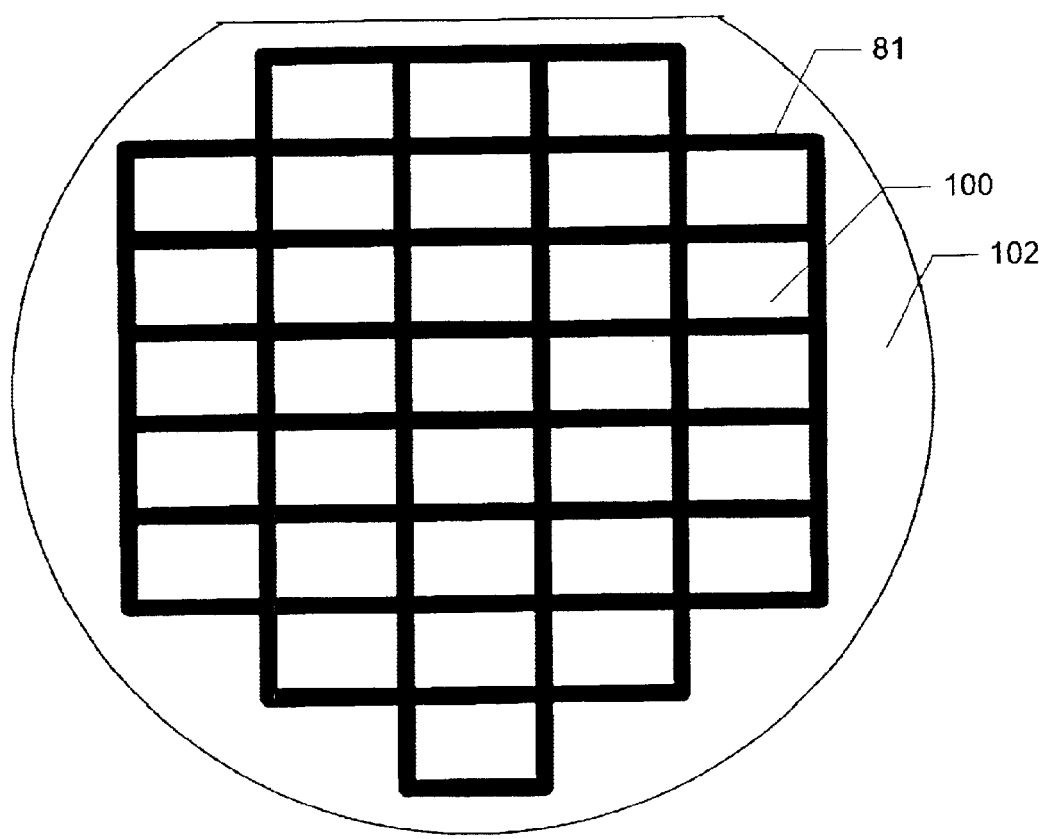
FIG. 15 is an illustration of light absorbing die frames on a light transmissive substrate.

As mentioned above in relation to FIGS. 11A and 11B, on the light transmissive wafer 80 (e.g. glass or quartz—preferably display grade glass) are formed masks 81a to 81e which will block visible light around a perimeter area of each die from reaching the mirror arrays after the two wafers are bonded and singularized. This "frame" of light absorbing material is preferably one that absorbs many wavelengths in the visible spectrum. An opaque material, preferably a black material is preferred for the mask around the perimeter of each die. Such frames or "masks" around each micro-mirror array are shown in FIG. 15. In this figure, a light transmissive substrate 102 is provided with light blocking/absorbing frame areas 100 that surround each die area 101 on the substrate 102. The material that forms the dark frame area 100 can be thin film deposited by CVD, PVD etc. and patterned to form the frame areas around each die area on the wafer. In one embodiment ion beam sputtered black chrome or niobium is used, that has a reflectance as low as 3% through the light transmissive substrate, with high thermal stability. After sputtering the film onto e.g. glass, it is etched to form the "frames" in each die area. The black chrome coating can be a multilayer structure of chrome and chromium oxide (to match the index of refraction, as in an antireflective coating laminate). Of course, other opaque films (preferably those with high optical density, thermally stable and with low reflectivity) can be deposited and patterned (the opacity and color of many films being variable due to deposition parameters). Light absorbing materials can be used such as black nickel, CrN, TiAlN, TaN and many films comprising carbon, such as amorphous CN, amorphous CAlN, TiC, TiCN, a-DLC, vitreous carbon, SiC, TiAlCN, WC, etc. Multilayer structures, such as TiC/WC, WC/C or TiAlN/WC/C, can be used, as well as other multilayer structures with matched indices. Also polyimides and other polymers containing carbon black (or other opacity increasing material) can be used. If the light-absorbing layer is exposed to an etchant at the time of release of the micro-mirrors, the light absorbing material should preferably be resistant to the etchant used.

Forming the light absorbing areas can be by any suitable film forming method—such as standard deposition and patterning techniques. For example, the metals and metal alloys can be deposited by sputtering a target in an inert atmosphere. Other techniques, such as electroplating can be used. For ceramic materials, a target can be reactively sputtered such as in a nitrogen atmosphere to form nitride ceramic films. Or, some films can be deposited by chemical vapor deposition as known in the art. Patterning of the films to form matrices, bands, strips or other designs can be by any suitable etching chemistry—such as by a chlorine (plasma) etch after deposition and patterning of a photoresist. It is also possible to deposit and pattern a photoresist followed by deposition of the light absorbing material.

Figure 14A:
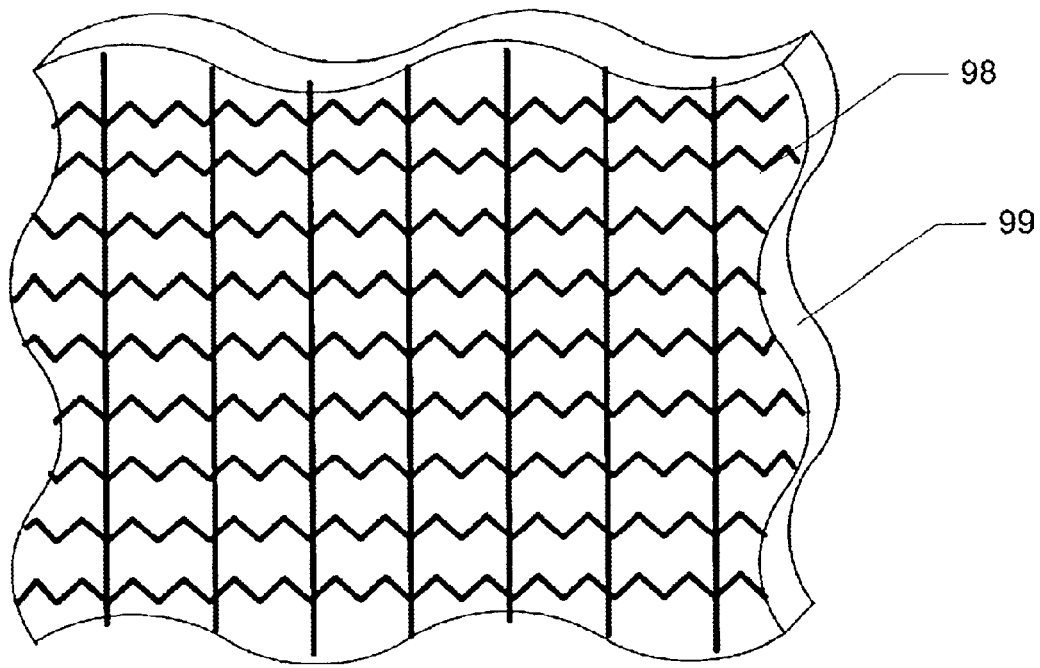
FIG. 14A is an illustration of a light absorbing matrix layer on the light transmissive substrate.
Figure 14B:
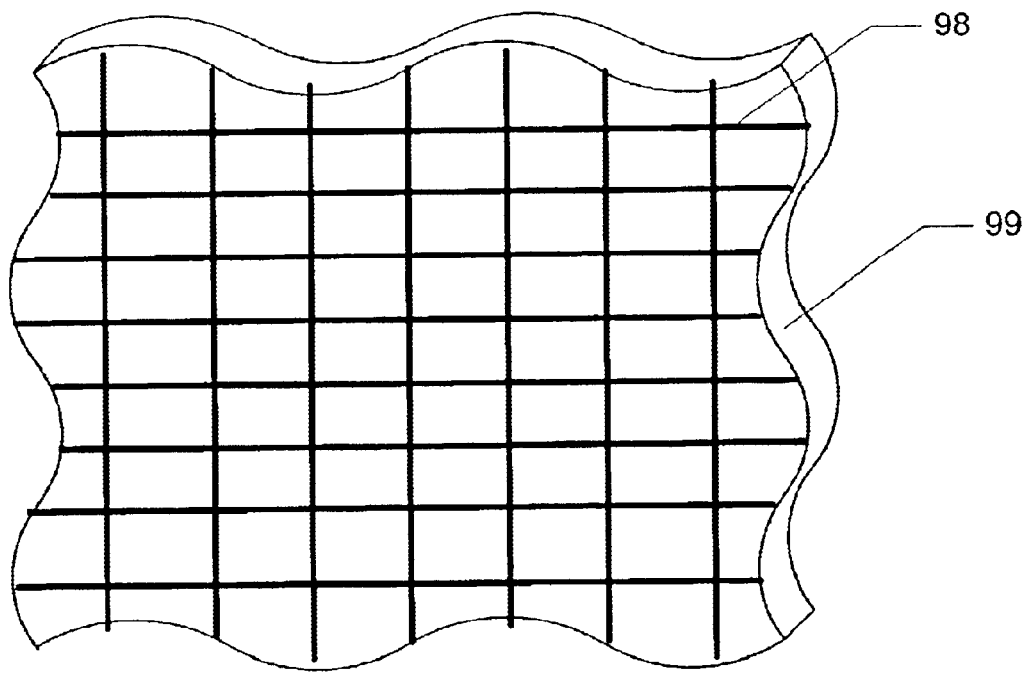
FIG. 14B is an illustration of another embodiment of a light absorbing matrix layer on the light transmissive substrate.

As mentioned elsewhere herein, in each die area (101 in FIG. 15) will be formed an array of micro-mirrors—possibly thousands or millions of such mirrors in each die area—depending upon the desired resolution of the image reflected from such micro-mirror array. A frame of light absorbing material, such as that disclosed above for surrounding each die area, can be provided on the light transmissive substrate to surround the area where each micro-mirror will be formed on the light transmissive substrate. Whereas the frame areas surrounding each die (such as in FIG. 15) are on the order of millimeters to centimeters in length, the frame areas that surround each micro-mirror are on the order of microns—depending upon the desired size of the micro-mirrors formed—e.g. from 5 to 25 microns. Such "micro-mirror frames" are illustrated in FIGS. 14A and 14B as a light absorbing matrix 98 on a substrate 99—where thousands or millions of such frames illustrated in FIGS. 14A and 14B can be disposed within a single light absorbing frame of FIG. 15. Or course it is not necessary that both micro-mirror frames of FIG. 14 and die frames of FIG. 15 be provided together. The materials used to form the micro-mirror frames can be those such as set forth above in relation to die frames and can include an AR coating (the AR coating can also cover the entire light transmissive substrate if desired.

The "frames" around the micro-mirrors and around the die areas (the micro-mirror array areas) can instead be provided in the form of strips or bands—where the light blocking or absorbing material is provided along some but not all sides of the micro-mirrors (or micro-mirror arrays). Also, though the light absorbing material is preferably provided on the same side of the light transmissive substrate as the micro-mirrors, it is also possible to deposit the light absorbing material on the side of the light transmissive substrate opposite from the formed micro-mirrors. If the light absorbing material is provided between the micro-mirrors and on the same side as the micro-mirrors, it can be deposited so as to be in the area of impact of the micro-mirrors on the light transmissive substrate. Such impacting of the micro-mirrors on the light transmissive substrate is discussed in detail in U.S. Pat. Nos. 6,356,378, 6,046,840 and 6,172,797 incorporated herein by reference. If the light absorbing strips or frames are disposed at such impact point of the micro-mirror, then preferably such material is a hard and at least minimally electrically conductive to allow dissipation of charge that builds up due to repeated impact of the micro-mirrors.

In the above embodiments, the light absorbing areas are provided on the same substrate as the micro-mirrors. However, it is also possible to form micro-mirrors on a circuit substrate (e.g. a silicon substrate having thereon circuitry, electrodes and micro-mirrors). In such a case, the light absorbing layers are provided on a separate light transmissive substrate that is held spaced apart from the circuit substrate—though preferably at a small distance such as 75 microns or less, preferably 50 microns or less, and more preferably at a closer distance e.g. less than 10 microns. It is possible to position the light transmissive substrate at a distance of from 1 to 5 microns. A close relationship between the light transmissive substrate and the micro-mirrors can allow for better blocking of light between adjacent micro-mirrors.

Figure 17:
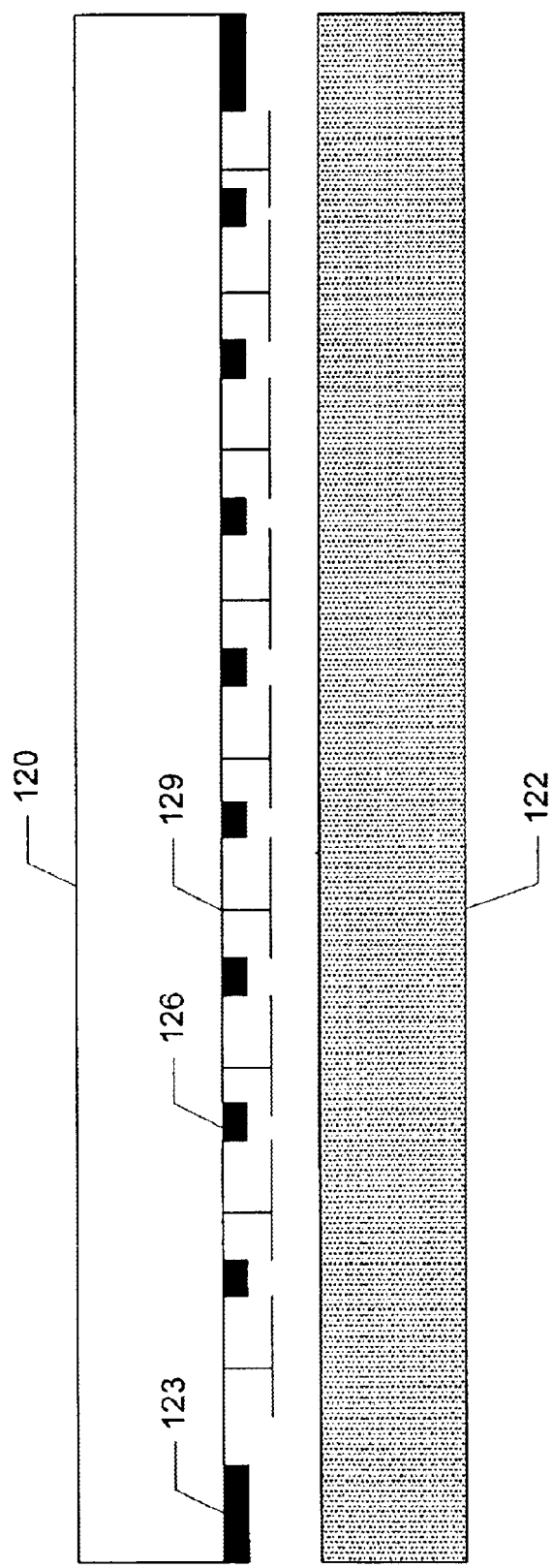
FIG. 17 is an illustration of a light absorbing grid or matrix on a light transmissive substrate with micro-mirrors on an adjacent circuit substrate.

An example of such an arrangement is illustrated in FIG. 17. As can be seen in this Figure, a substrate 122 (e.g. a silicon substrate) with circuitry and electrodes thereon (not shown) has formed above the circuitry and electrodes an array of micro-mirrors 129. In the example of FIG. 17, for ease of illustration only a few micro-mirrors are shown along the length of the mirror array—of course an actual mirror array would likely have hundreds or thousands of micro-mirrors along one dimension of the array—depending upon the desired resolution of the projection display. In the example of FIG. 17, each micro-mirror would have two electrodes disposed on the substrate below for tilting the micro-mirror in opposite directions depending upon which electrode causes electrostatic attraction of the adjacent micro-mirror. Of course other arrangements, such as micro-mirrors pivotable towards the substrate in a single direction, could be used.

Substrate 120 is a light transmissive substrate, such as a plastic, glass or quartz substrate—preferably a display grade glass substrate. Formed on substrate 120 is a frame 123 that surrounds the micro-mirror array. Frame 123 in many cases will be a frame disposed as a rectangular thin film but it is also possible for a material that acts as a spacer to space the substrates 120 and 122 apart, or as a bonding agent, to be opaque and act as the frame surrounding the micro-mirror array. Also disposed on substrate 120 are light absorbing areas 126 that are disposed between the micro-mirrors 129 when the two substrates are disposed adjacent each other. Though the light absorbing areas 126 can be in the form of strips or other patterns, it is preferred that the light absorbing areas are a grid or matrix that allows light to pass in areas where the micro-mirrors are disposed, but blocks light in areas corresponding to gaps between the micro-mirrors. The materials for forming the light absorbing areas 123 and 126 can be as in the other embodiments hereinabove. Also, substrates 120 and 122 can be bonded directly together or indirectly via packaging or other structure.

In a preferred embodiment, the substrates are bonded together at the wafer level by a) bonding e.g. a glass wafer and a silicon wafer together and then singularizing into dies, or b) bonding glass (or other light transmissive material) dies or caps having the light absorbing strips or grids to a semiconductor (or other circuit containing) wafer and then singularizing the semiconductor wafer. It is preferred that the substrates 120 and 122 be disposed close to each other (or, if substrate 120 is in the form of a concave "cap", then the area of the cap having the matrix be disposed close to substrate 122). Preferably the substrates are disposed at a distance of less than 75 microns, and more preferably less than 50 microns. Or course, closer distances are easily achieved particularly if the two substrates are bonded together. Substrate distances of 10 microns or less can be achieved, or even 5 microns or less if desired.

Though the light transmissive substrate (e.g. a glass or quartz wafer) can be a window in the micro-mirror package, it is also possible to bond the light transmissive substrate directly to the semiconductor (silicon substrate with circuitry) at the die or wafer level—preferably at the die level. In this way, the light transmissive substrate is bonded directly to the semiconductor substrate—allowing a close gap between the two substrates. Bonding the two substrates at the wafer level also allows for protecting the micro-mirrors during wafer singulation into dies—such as set forth in US patent application 20030054588 to Patel et al. filed Dec. 3, 2001, incorporated herein by reference.

Figure 16A:
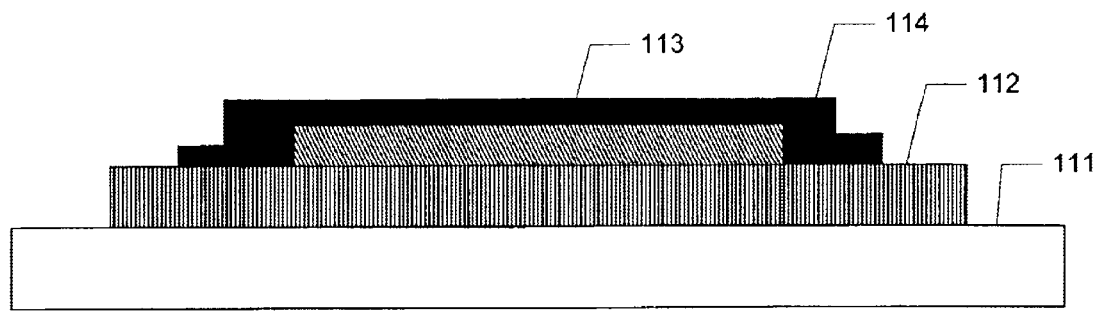
FIGS. 16A to 16F are illustrations of light absorbing edges formed along micro-mirror elements.

Another design for reducing scattering of light and increasing the contrast ratio is by providing a light absorbing layer or strip along the edges of the micro-mirrors. The light absorbing material can be the same as disclosed above with respect to the light absorbing matrices. As can better be seen in FIG. 16A, a substrate 111 (this can be a light transmissive substrate such as glass, or a semiconductor substrate with actuation circuitry thereon) is provided on which is deposited a sacrificial layer 112, which can be of any suitable material such as those sacrificial materials disclosed elsewhere herein. After depositing sacrificial layer 112, mirror layer 113 is formed. Mirror layer 113 can be a single layer of a reflective material, such as a metal, metal alloy or metal compound, or a laminate of structural materials, where preferably one of the layers is reflective. On layer(s) 113 is deposited light absorbing layer 114. Each of the layers in FIG. 16A can be patterned prior to depositing the next layer (or patterned together with adjacent layers, depending upon the material of the adjacent layers). And, it should be noted that FIGS. 16A and 16B are simplified views—additional layers such as hinge layers above or below the mirror plate 113 (depending upon whether substrate 111 is light transmissive or not) would also generally be provided if the hinge is not formed in the same layer as the mirror plate.

Figure 16B:
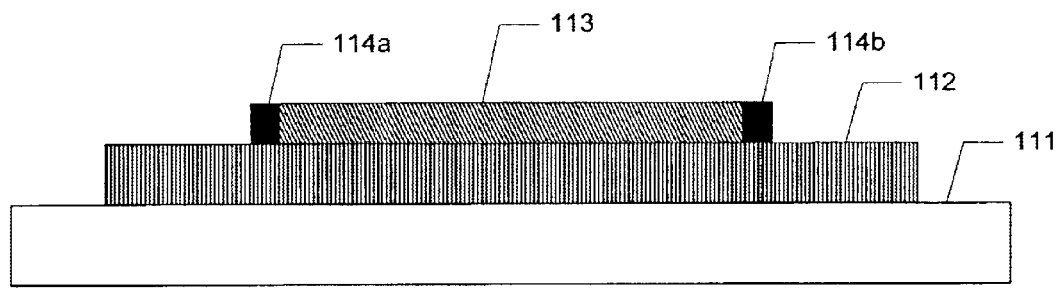
Figure 16C:
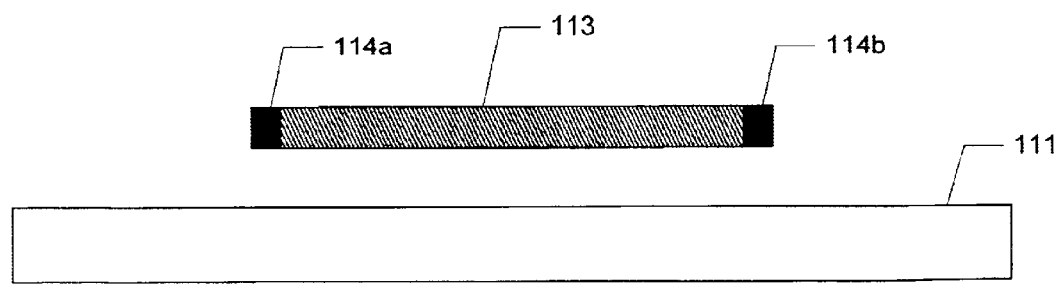

As can be seen in FIG. 16B, light-absorbing layer 114 is directionally etched removing almost all of the light-absorbing layer except for strips of light absorbing material 114a and 114b along sides of the mirror plate 113. Once the sacrificial layer 112 is removed as shown in FIG. 16C, a hinged reflective micro-mirror element having non-reflective light absorbing edges is formed, pivotably suspended above substrate 111. As with the light absorbing matrices, the light absorbing mirror edges are preferably dark colored, preferably black. Also, though the light absorbing mirror edges can be formed with deposition followed by directional etching as mentioned above, use of photoresist to selectively deposit the light absorbing material only around the edges of the micro-mirror (or along the edges and "backside" of the micro-mirror), or using photoresist for etching the light absorbing layer, can be performed. Many different combinations of materials and deposition and patterning methods can be employed.

Figure 16D:
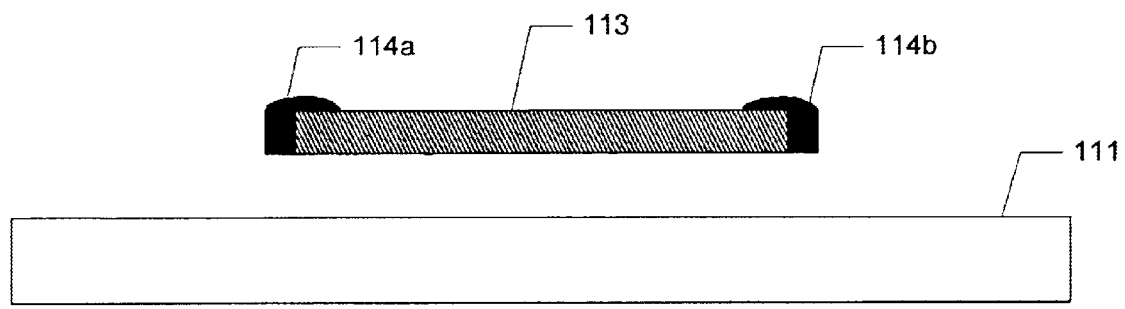
Figure 16E:
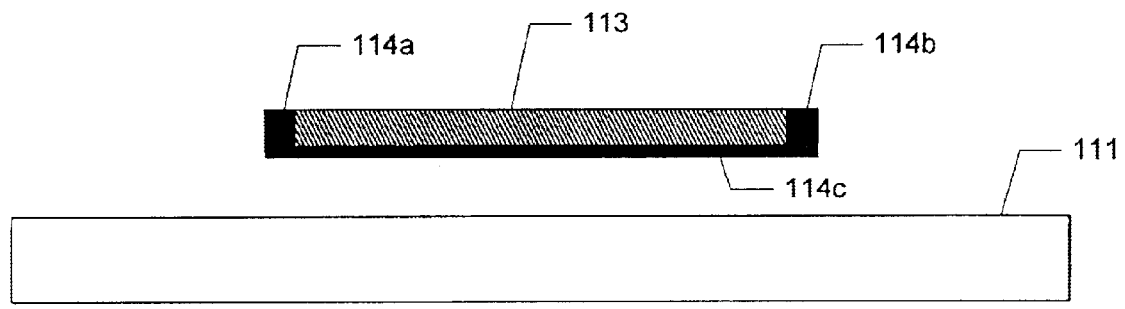

In addition to the edges or sidewalls of the micro-mirror, the periphery of the reflective surface proximate to the edges or sidewalls can also be coated with light absorbing materials, as shown in FIG. 16D. In this way, scattered light from defects and/or roughness near the edges may thus be reduced, if not eliminated.

Figure 16F:
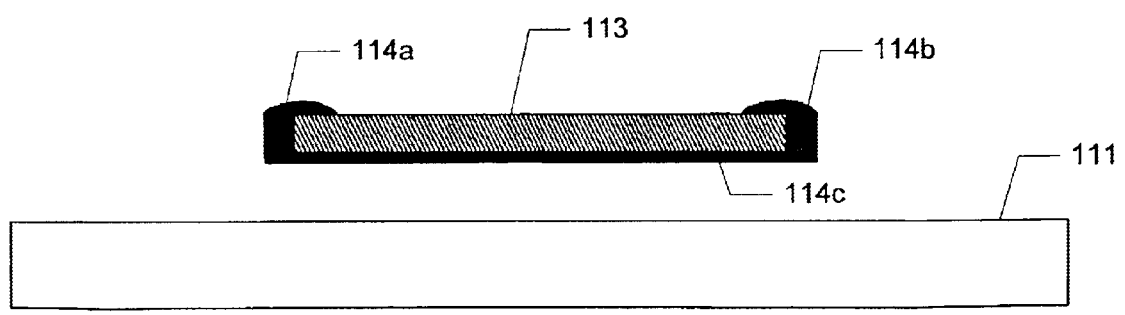

In many operations, the backside surface opposite to the reflective surface for reflecting incident light can also increase scattered light, which scattered light can be collected by the projection lens or lenses of the projection system, thus reducing the contrast ratio. To eliminate this scattered light, the backside surface of the micro-mirror can then be covered with a light-absorbing layer, for example, layer 114C in FIG. 16E. It is also possible to cover the periphery of the micromirror surface, the edges or sidewalls and/or the underside of the micromirror, such as can be seen in FIG. 16F.

Figure 18A:
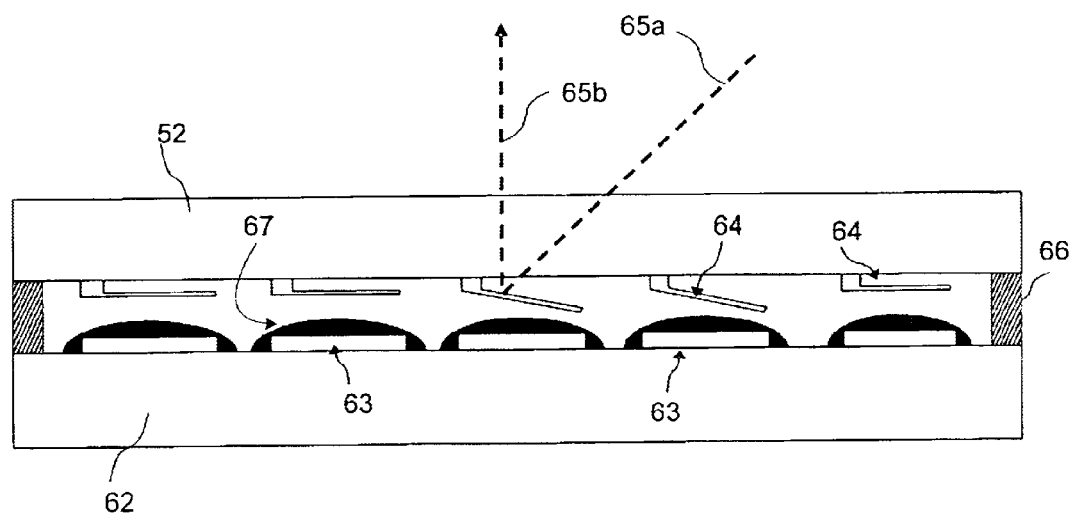
FIGS. 18A and 18B are illustrations of light absorbing areas formed on the wafer with circuitry thereon, wherein FIG. 18A demonstrates absorbing areas formed on the electrodes; and wherein FIG. 18B demonstrates absorbing areas between adjacent electrodes.
Figure 18B:
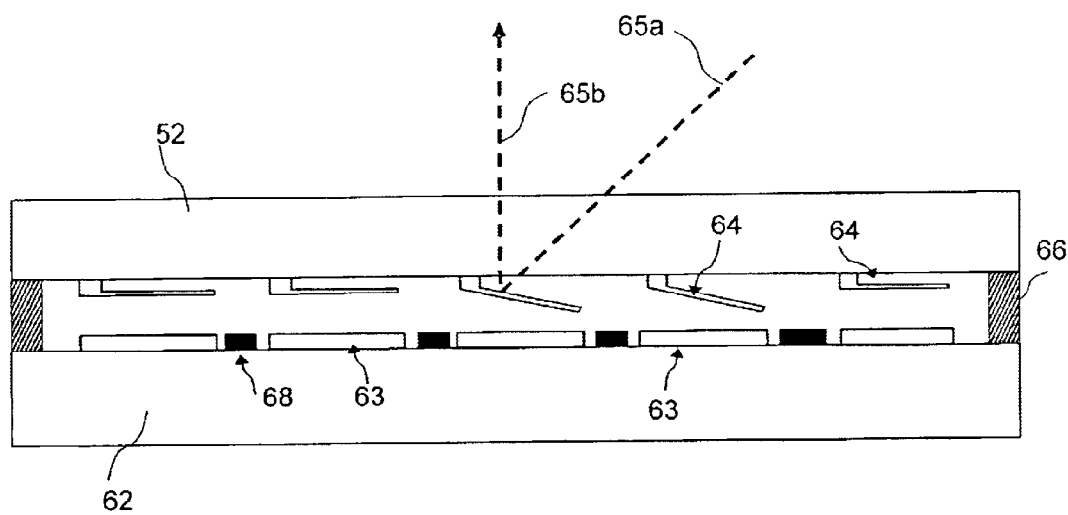

Whether for a situation when the micro-mirror plate and the backplane wafer with electrodes and control circuitry built thereon are separate, or whether for a situation where the control circuitry, electrodes and micromirrors are formed on the same substrate, light-absorbing materials can be deposited on the backplane to reduce the scattered light from the backplane, as shown in FIGS. 18A and 18B. Referring to FIG. 18A, electrodes 63 can be covered with light-absorbing materials 67. FIG. 18B illustrates that all electrodes are covered with light-absorbing material 67, however, this is not necessary. Instead, this substrate can be selectively covered with the light-absorbing material as appropriate.

For example, light-absorbing strips 68 can be deposited in the spaces between adjacent electrodes 63, as shown in FIG. 18B. The scattered light from these spaces can thus be reduced, if not eliminated. As an optional feature, electrodes and the spaces between adjacent electrodes can be selectively covered with light-absorbing materials either individually or in combination as appropriate (not shown).

Preferably, the light transmissive substrate bonded to the semiconductor substrate (or other substrate having circuitry and electrodes thereon) hermetically seals the MEMS elements from the surrounding environment, and preferably at a pressure lower than the surrounding environment. In order to achieve the lower pressure, the two substrates (dies or wafers) are bonded together at subatmospheric pressure and hermetically sealed (followed by wafer singulation if performed at the wafer level). Or, the two substrates could be bonded at ambient pressure, though not hermetically, followed by a second seal at a lower pressure that hermetically seals off the interior of the bonded substrates from the surrounding environment. In one example of such a method, the two substrates are first bonded with an adhesive (e.g. epoxy or silicone) followed by soldering (this can be application of a solder or solder reflow) or other hermetic seal (e.g. glass frit seal) if the adhesive is insufficiently hermetic. It is also possible to perform both seals at subatmospheric pressure, or perform such a double seal at ambient pressure if it is not desired to have a lower pressure within the area between the two substrates. In addition, it may be desirable, whether at lower pressure or not, to seal the two substrates with a gas other than air, such as an inert gas or gases (nitrogen, helium, etc.), or moisture can be added if an anti-stiction agent would better perform if some moisture is present in the package. This packaging can also be desirable for a monolithic MEMS device where both the circuitry and MEMS elements are on the same substrate, as well as where the MEMS elements are formed on a substrate different from the circuitry.

If an anti-stiction agent is deposited on the MEMS elements after release, but before bonding the substrates together, it may be desirable to protect the areas that will be required for bonding (e.g. if an adhesive is used—protecting those areas where the adhesive will be applied), followed by application of the anti-stiction agent, in turn followed by removing the protecting agent or film, followed in turn by application of the bonding agent. Such a film could be applied in strips or rings that correspond to the location of the later applied bonding agent, and could be a photoresist or an inorganic thin film applied by CVD or sputtering. In the alternative, the MEMS elements could be released, followed by application of an anti-stiction agent. Then, the applied anti-stiction agent (e.g. a self assembled monolayer formed from chlorosilane or alkoxysilane precursors) is removed in the areas where the bonding agent will be applied (in any pattern—though preferably circumferentially around the micro-mirror array if the MEMS elements are micro-mirrors in an array). Removal can be accomplished by laser ablation (preferably focusing laser above the substrate), particle beam, application of a stripping chemical (e.g. acetone) or even mechanical removal (scoring with a hard or soft object or with a polishing wheel).

There are many alternatives to the method of the present invention. In order to bond the two wafers, epoxy can be applied to the one or both of the upper and lower wafers. In a preferred embodiment, epoxy is applied to both the circumference of the wafer and completely or substantially surrounding each die/array on the wafer. Spacers can be mixed in the epoxy so as to cause a predetermined amount of separation between the wafers after bonding. Such spacers hold together the upper and lower wafers in spaced-apart relation to each other. The spacers act to hold the upper and lower wafers together and at the same time create a space in which the movable mirror elements can move. Alternatively, the spacer layer could comprise walls or protrusions that are micro-fabricated. Or, one or more wafers could be bonded between the upper and lower wafers and have portions removed (e.g. by etching) in areas corresponding to each mirror array (thereby providing space for deflection of the movable elements in the array). The portions removed in such intermediate wafers could be removed prior to alignment and bonding between the upper and lower wafers, or, the wafer(s) could be etched once bonded to either the upper or lower wafer. If the spacers are micro-fabricated spacers, they can be formed on the lower wafer, followed by the dispensing of an epoxy, polymer, or other adhesive (e.g. a multi-part epoxy, or a heat or UV-cured adhesive) adjacent to the micro-fabricated spacers. The adhesive and spacers need not be co-located, but could be deposited in different areas on the lower substrate wafer. Alternative to glue, a compression bond material could be used that would allow for adhesion of the upper and lower wafers. Spacers micro-fabricated on the lower wafer (or the upper wafer) and could be made of polyimide, SU-8 photo-resist.

Instead of microfabrication, the spacers could be balls or rods of a predetermined size that are within the adhesive when the adhesive is placed on the lower wafer. Spacers provided within the adhesive can be made of glass or plastic, or even metal so long as the spacers do not interfere with the electrostatic actuation of the movable element in the upper wafer. Regardless of the type of spacer and method for making and adhering the spacers to the wafers, the spacers are preferably from 1 to 250 microns, the size in large part depending upon the size of the movable mirror elements and the desired angle of deflection. Whether the mirror arrays are for a projection display device or for optical switching, the spacer size in the direction orthogonal to the plane of the upper and lower wafers is more preferably from 1 to 100 microns, with some applications benefiting from a size in the range of from 1 to 20 microns, or even less than 10 microns.

Regardless of whether the micro-mirrors and circuitry are formed on the same wafer or on different wafers, when the micro-mirrors are released by removal of the sacrificial layer, a sticking force reducing agent can be applied to the micro-mirrors on the wafer to reduce adhesion forces upon contact of the micro-mirrors with another layer or structure on the same or opposing substrate. Though such adhesion reducing agents are known, in the present invention the agent is preferably applied to the wafer before wafer bonding (or after wafer bonding but before singulation), rather than to the singularized die or package for the die. Various adhesion reducing agents, including various trichlorosilanes, and other silanes and siloxanes as known in the art for reducing stiction for micro electromechanical devices, as mentioned elsewhere herein.

Also, a getter or molecular scavenger can be applied to the wafer prior to wafer bonding as mentioned above. The getter can be a moisture, hydrogen, particle or other getter. The getter(s) is applied to the wafer around the released MEMS structures (or around, along or adjacent an array of such structures, e.g. in the case of a micro-mirror array), of course preferably not being in contact with the released structures. If a moisture getter is used, a metal oxide or zeolite can be the material utilized for absorbing and binding water (e.g. StayDry SD800, StayDry SD1000, StayDry HiCap2000—each from Cookson Electronics). Or, a combination getter could be used, such as a moisture and particle getter (StayDry GA2000-2) or a hydrogen and moisture getter (StayDry H2-3000). The getter can be applied to either wafer, and if adhesive bonding is the bonding method, the getter can be applied adjacent the epoxy beads or strips, preferably between the epoxy and the micromirrors, and can be applied before or after application of the adhesive (preferably before any adhesive is applied to the wafer(s). In one embodiment, a getter (or getters if more than one type of getter is used) is provided in a trench or other cavity formed in either (or both) substrates. For example, a trench extending along one or more sides of a micro-mirror array (or around the entire periphery of the array) could be formed prior to depositing the sacrificial layer and thin films (or at the end before or after release of the micro-mirrors). Such a trench (or cavity) could be formed in a silicon substrate (e.g. with circuitry and electrodes thereon if formed as the dual substrate approach set forth above, or circuitry, electrodes and micro-mirrors thereon if formed monolithically). Or such a trench or cavity for the getter(s) could be formed in the glass substrate. It is also possible to form a trench or cavity in both substrates with the same or different getters deposited therein.

In the method of the invention, the first wafer is preferably glass, borosilicate, tempered glass, quartz or sapphire, or can be a light transmissive wafer of another material. The second wafer can be a dielectric or semiconductor wafer, e.g. GaAs or silicon. As noted above, the first and second wafers are bonded together with an adhesive (though metal or anodic bonding are also possible), depending upon the MEMS structure and the type of micromachining.

The releasing can be performed by providing any suitable etchant, including an etchant selected from an interhalogen, a noble gas fluoride, a vapor phase acid, or a gas solvent. And, the releasing is preferably followed by a stiction treatment (e.g. a silane, such as a chlorosilane). Also, a getter can be applied to the wafer before or after the adhesion reducing agent is applied, and before or after an adhesive is applied (if an adhesive bonding method is chosen). Preferably the time from releasing to bonding is less than 12 hours, and preferably less than 6 hours.

Specific mirrors and methods for projection displays or optical switching could be used with the present invention, such as those mirrors and methods set forth in U.S. Pat. No. 5,835,256 to Huibers issued Nov. 10, 1998; U.S. Pat. No. 6,046,840 to Huibers issued Apr. 4, 2000; US patent application 20010040675 to True et al. filed Jan. 22, 2001; Ser. No. 09/564,069 to Richards filed May 3, 2000(now U.S. Pat. No. 6,388,661 issued May 14, 2002); Ser. No. 09/617,149 to Huibers et al. filed Jul. 17, 2000(now U.S. Pat. No. 6,337,761 issued Jan. 8, 2002); Ser. No. 09/631,536 to Huibers et al. filed Aug. 3, 2000 (now U.S. Pat. No. 6,529,310 issued Mar. 4, 2003); Ser. No. 09/626,780 to Huibers filed Jul. 27, 2000; 20020197761 to Patel et al. filed May 22, 2001; Ser. No. 09/637,479 to Huibers et al. filed Aug. 11, 2000 (now U.S. Pat. No. 6,396,619 issued May 28, 2002); and 60/231,041 to Huibers filed Sep. 8, 2000. Particular mirror shapes disclosed in U.S. patent application Ser. No. 09/732,445 to Ilkov et al. filed Dec. 7, 2000 could be used. In addition, the sacrificial materials, and methods for removing them, could be those disclosed in US patent application 20030047533 to Reid et al. filed Jun. 15, 2001. Lastly, assembly and packaging of the MEMS device could be such as disclosed in US patent application 20020132389 filed Mar. 15, 2001. Each of these patents and applications is incorporated herein by reference.

The invention has been described in terms of specific embodiments. Nevertheless, persons familiar with the field will appreciate that many variations exist in light of the embodiments described herein.

We claim:

1. A method for making a spatial light modulator, comprising:

providing a first substrate that is transmissive to visible light;

providing a second substrate having an array of circuitry and electrodes thereon;

depositing a light absorbing layer on the first substrate to selectively block the passage of light through the first substrate, wherein the light absorbing layer is black or dark in color;

forming an array of deflectable reflective elements on the first or second substrate; and positioning the first and second substrates proximate to each other to form a substrate assembly, further comprising:

bonding the first and second substrates together to form the substrate assembly; and singulating the substrate assembly into a set of assembly dies, each of which comprises a plurality of deflectable reflective elements.

2. The method of claim 1, wherein the light absorbing layer is formed as a frame such that after singulation, each assembly die is surrounded by the frame.

3. The method of claim 1, wherein the deflectable reflective elements correspond to pixels in a direct-view or projection display.

4. The method of claim 1, wherein the light absorbing layer is formed as a rectangular frame on the first substrate surrounding the array of deflectable reflective elements.

5. The method of claim 4, wherein light absorbing material is deposited on the first substrate to further form areas that decrease the amount of light that enters gaps between the deflectable elements.

6. The method of claim 1, wherein the light absorbing layer is formed as strips, frames or a grid on the first substrate fully or partially surrounding each deflectable element, when viewed from above, so as to decrease light that enters gaps between adjacent deflectable elements.

7. The method of claim 4, wherein the light absorbing layer is deposited prior to fanning the array of deflectable reflective elements.

8. The method of claim 4, wherein the light absorbing layer is deposited after forming the array of deflectable reflective elements.

9. The method of claim 1, wherein the first and second substrates are bonded together with an adhesive.

10. The method of claim 1, wherein the light absorbing layer absorbs at least 50% of the light in areas where the light absorbing layer is disposed.

11. The method of claim 10, wherein the light absorbing layer absorbs at least 75% of the light in areas where the light absorbing layer is disposed.

12. The method of claim 11, wherein the light absorbing layer absorbs at least 85% of the light in areas where the light absorbing layer is disposed.

13. The method of claim 1, wherein the light absorbing layer is a light absorbing matrix.

14. The method of claim 13, wherein the number of reflective elements in each die is from 6,000 to about 6 million.

15. The method of claim 1, wherein the first substrate is an optically transmissive substrate or a substrate having one or more layers that when removed result in an optically transmissive substrate in an area other than in an area of the light absorbing layer.

16. The method of claim 15, wherein the first substrate is glass, borosilicate, tempered glass, quartz or sapphire.

17. The method of claim 1, wherein the second substrate is a dielectric or semiconductor substrate.

18. The method of claim 17, wherein the second substrate comprises GaAs or silicon.

19. The method of claim 1, wherein the bonding comprises applying an adhesive and spacers, the spacers having a size of from 1 to 100 microns.

20. The method of claim 19, wherein the spacers have a size of from 1 to 20 microns.

21. The method of claim 1, wherein the plurality of deflectable elements are reflective mirror elements and are formed on the second substrate which is a light transmissive substrate when in use except in areas of the light absorbing layer.

22. The method of claim 1, wherein the circuitry and plurality of electrodes are funned prior to forming the plurality of deflectable elements, wherein the plurality of deflectable elements is formed above the plurality of electrodes on the second substrate.

23. The method of claim 22, wherein a plurality of light absorbing masks are formed on the first substrate.

24. The method of claim 23, wherein when the substrate assembly is singulated into substrate assembly dies, a light absorbing mask is disposed on a first substrate portion within each substrate assembly die.

25. The method of claim 1, wherein the plurality of deflectable elements is formed on the first substrate.

26. The method of claim 25, wherein when the first and second substrates are aligned and bonded together, the deflectable elements on the first substrate are each disposed proximate to a corresponding electrode on the second substrate.

27. The method of claim 1, wherein the deflectable elements are micromirrors having jagged or zig-zag edges.

28. The method of claim 1, further comprising applying a stiction reducing agent to one or both substrates before or after bonding the two substrates together, but before singulating the substrate assembly into dies.

29. The method of claim 28, wherein the stiction reducing agent is a silane applied to the deflectable elements.

30. The method of claim 28, wherein the stiction reducing agent is a chlorosilane.

31. The method of claim 1, further comprising the singulated die into a projection system that comprises a light source, a color sequencer and projection optics.

32. The method of claim 1, wherein the light absorbing layer is provided as a grid or matrix on the light transmissive substrate.

33. The method of claim 1, wherein the light absorbing layer is provided as strips or bands on the light transmissive substrate.

34. The method of claim 1, wherein the light absorbing layer is black nickel or black chrome.

35. The method of claim 1, wherein the light absorbing layer is a black or dark colored metal or metal alloy.

36. The method of claim 1, wherein the light absorbing layer is a carbon containing polymer.

37. The method of claim 1, wherein the light absorbing layer is deposited by sputtering.

38. The method of claim 1, wherein the light absorbing layer is a carbon containing film.

39. The method of claim 1, wherein the light absorbing layer comprises a carbon compound.

40. The method of claim 1, wherein the light absorbing layer is a multilayer laminate.

41. The method of claim 1, wherein the light transmissive substrate comprises an AR coating on a surface opposite to the surface having the light absorbing layer.

42. The method of claim 1, wherein the light absorbing layer is alight absorbing frame surrounding each micromirror.

43. The method of claim 1, wherein the light absorbing layer comprises a plurality of light blocking strips, each of which are proximate to a gap between adjacent micromirrors.

44. The method of claim 1, wherein the light absorbing layer is a set of light absorbing frames, each of which surrounding a micromirror.

45. The method of claim 44, wherein the light absorbing frame surrounding each micromirror is on the same side of the first substrate as the micromirrors.

46. The method of claim 45, wherein the light absorbing frame is on a side of the first substrate opposite to the side on which the micromirrors are formed.

47. The method of claim 1, wherein the first substrate is bonded to the second substrate at a distance of 75 microns or less from the second substrate.

48. The method of claim 47, wherein the first substrate is bonded to the second substrate at a distance of less than 10 microns from the second substrate.

49. A projection system, comprising:
a light source;
the spatial light modulator of claim 1 for reflecting a beam of light from the light source; and
projection optics for projecting light reflected off of the spatial light modulator.

50. A spatial tight modulator, comprising:
a first substrate that is transmissive to visible light;
a second substrate having an array of circuitry and electrodes thereon;
a light absorbing layer on the first substrate disposed to selectively block the passage of light through the first substrate, wherein the light blocking layer is black or dark in color; and
an array of deflectable reflective elements on the first or second substrate;
wherein the first and second substrates are positioned proximate to each other as a substrate assembly.

51. The spatial light modulator of claim 50, wherein the reflective elements correspond to pixels in a direct-view or projection display.

52. The spatial light modulator of claim 50, wherein the light absorbing layer is formed as a rectangular frame on the first substrate surrounding the any of deflectable reflective elements as viewed from above.

53. The spatial light modulator of claim 52, wherein a further light absorbing area is formed as strips, frames or a grid for blocking light between adjacent deflectable elements.

54. The spatial light modulator of claim 50, wherein the first and second substrates are bonded together.

55. The spatial light modulator of claim 50, wherein the light absorbing layer absorbs at least 50% of the light in areas where the light absorbing layer is disposed.

56. The spatial light modulator of claim 55, wherein the light absorbing layer absorbs at least 75% of the light in areas where the light absorbing layer is disposed.

57. The spatial light modulator of claim 56, wherein the light absorbing layer absorbs at least 85% of the light in areas where the light absorbing layer is disposed.

58. The spatial light modulator of claim 50, wherein the light absorbing layer is a light absorbing matrix.

59. The spatial light modulator of claim 58, wherein the number of reflective elements in a die area is from 6,000 to about 6 million.

60. The spatial light modulator of claim 50, wherein the first substrate is an optically transmissive substrate in areas other than in the area of the light absorbing layer.

61. The spatial light modulator of claim 60, wherein the first substrate is glass, borosilicate, tempered glass, quartz or sapphire.

62. The spatial light modulator of claim 50, wherein the second substrate is a glass or quartz substrate.

63. The spatial light modulator of claim 50, wherein the second substrate is a dielectric or semiconductor substrate.

64. The spatial light modulator of claim 63, wherein the second substrate comprises GaAs or silicon.

65. The spatial light modulator of claim 50, wherein the first and second substrates are bonded together with an adhesive.

66. The spatial light modulator of claim 50, wherein the second substrate is a glass substrate.

67. The spatial light modulator of claim 50, wherein the plurality of deflectable elements are reflective mirror elements and are held on the second substrate which is a light transmissive substrate.

68. The spatial light modulator of claim 50, wherein the plurality of deflectable elements are formed on the second substrate.

69. The spatial light modulator of claim 68, wherein the circuitry and plurality of electrodes are disposed on the second substrate, wherein the plurality of deflectable elements are formed spaced above the plurality of electrodes on the second substrate.

70. The spatial light modulator of claim 69, wherein a plurality of light absorbing masks are formed on the first substrate.

71. The spatial light modulator of claim 70, wherein the substrate assembly is a substrate assembly die having a light absorbing mask disposed on a first substrate portion within the substrate assembly die.

72. The spatial light modulator of claim 50, wherein the plurality of deflectable elements is formed on the first substrate.

73. The spatial light modulator of claim 50, wherein the deflectable elements are micromirrors having jagged or zig-zag edges.

74. The spatial light modulator of claim 50, further comprising a stiction reducing agent on one or both substrates.

75. The spatial light modulator of claim 50, further comprising a getter on one or both substrates.

76. The spatial light modulator of claim 75, wherein the getter is a molecular, hydrogen and/or particle getter.

77. The spatial light modulator of claim 75, wherein the getter is a particulate and moisture getter.

78. The spatial light modulator of claim 75, wherein the getter is capable of absorbing moisture.

79. The spatial light modulator of claim 50, wherein the light absorbing layer is provided as strips or bands on the light transmissive substrate.

80. The spatial light modulator of claim 50, wherein the light absorbing layer is black nickel or black chrome.

81. The spatial light modulator of claim 50, wherein the light absorbing layer is a black or dark colored metal or metal alloy.

82. The spatial light modulator of claim 50, wherein the light absorbing layer is a carbon containing polymer.

83. The spatial light modulator of claim 50, wherein the light absorbing layer is deposited by sputtering.

84. The spatial light modulator of claim 50, wherein the light absorbing layer is a carbon containing film.

85. The spatial light modulator of claim 50, wherein the light absorbing layer comprises a carbon compound.

86. The spatial light modulator of claim 50, wherein the light absorbing layer is a multilayer laminate.

87. The spatial light modulator of claim 50, wherein the light transmissive substrate comprises an AR coating on a surface opposite to the surface having the light absorbing layer.

88. The spatial light modulator of claim 50, wherein the light absorbing layer is a light absorbing frame around each die area.

89. The spatial light modulator of claim 50, wherein tho light absorbing layer is a light absorbing frame surrounding each micromirror.

90. The spatial light modulator of claim 50, wherein the light absorbing layer comprises light absorbing strips proximate to gaps between adjacent micromirrors.

91. The spatial light modulator of claim 88, wherein the light absorbing layer is a light absorbing frame surrounding each micromirror.

92. The spatial light modulator of claim 91, wherein the light absorbing frame surrounding each micromirror is on the same side of the first substrate as the micromirrors.

93. The spatial light modulator of claim 92, wherein the light absorbing frame surrounding each die is on a side of the first substrate opposite to the side on which the micromirrors are formed.

94. The spatial light modulator of claim 50, wherein the first substrate is bonded to the second substrate at a distance of 75 microns or less from the second substrate.

95. The spatial light modulator of claim 94, wherein the first substrate is bonded to the second substrate at a distance of less than 10 microns from the second substrate.

96. The spatial light modulator of claim 95, wherein the first substrate is bonded to the second substrate at a distance of from 1 to 10 microns from the second substrate.

97. A method for making a spatial light modulator, comprising:
 providing a first substrate and a second substrate;
 forming an array of circuitry and electrodes on the second substrate;
 forming a plurality of strips or frame areas on the first substrate to absorb at least 50% of the light incident on the strips or frame areas;
 forming an array of deflectable reflective elements on the first or second substrate; and
 bonding the first and second substrates together to form a substrate assembly.

98. A spatial light modulator, comprising:
 a first substrate arid a second substrate;
 an array of circuitry and electrodes on the second substrate;
 an opaque layer that forms a pattern on the first substrate in order to absorb at least 50% of the light that is incident on the opaque layer; and
 an array of deflectable reflective elements on the first or second substrate;
wherein the first and second substrates are positioned proximate to each other as a substrate assembly.

99. A method for making a spatial light modulator, comprising:
 providing a first substrate that is transmissive to visible light;
 providing a second substrate having an array of circuitry and electrodes thereon;
 depositing a light absorbing layer on the first substrate to selectively block the passage of light through the first substrate, wherein the light absorbing layer is black or dark in color;
 forming an array of deflectable reflective elements; and
 positioning the first and second substrates proximate to each other to form a substrate assembly such that the array of deflectable reflective elements are positioned between the first and second substrates, further comprising:
 bonding the first and second substrates together to form the substrate assembly; and
 singulating the substrate assembly into a set of assembly dies, each of which comprises a plurality of deflectable reflective elements.

* * * * *

UNITED STATES PATENT AND TRADEMARK OFFICE
CERTIFICATE OF CORRECTION

PATENT NO. : 6,906,847 B2
DATED : June 14, 2005
INVENTOR(S) : Huibers et al.

It is certified that error appears in the above-identified patent and that said Letters Patent is hereby corrected as shown below:

Drawings,
"Figs. 9A to 9G" should read -- Figs. 9A to 9E. --.

Signed and Sealed this

Twenty-seventh Day of September, 2005

JON W. DUDAS
*Director of the United States Patent and Trademark Office*